(12) United States Patent
Guo et al.

(10) Patent No.: US 12,106,971 B2
(45) Date of Patent: Oct. 1, 2024

(54) HIGH CONDUCTIVE PASSIVATION LAYERS AND METHOD OF FORMING THE SAME DURING HIGH ASPECT RATIO PLASMA ETCHING

(71) Applicant: American Air Liquide, Inc., Fremont, CA (US)

(72) Inventors: Xiangyu Guo, Bear, DE (US); Kayla Diemoz, Newark, DE (US); Nathan Stafford, Damascus, OR (US)

(73) Assignee: American Air Liquide, Inc., Fremont, CA (US)

( * ) Notice: Subject to any disclaimer, the term of this patent is extended or adjusted under 35 U.S.C. 154(b) by 0 days.

(21) Appl. No.: 17/135,216

(22) Filed: Dec. 28, 2020

(65) Prior Publication Data
US 2022/0223431 A1  Jul. 14, 2022

(51) Int. Cl.
*H01L 21/311*  (2006.01)

(52) U.S. Cl.
CPC .. *H01L 21/31144* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 4,836,905 A * | 6/1989 | Davis | C23C 14/568 204/192.12 |
| 5,840,630 A * | 11/1998 | Cecere | C23F 4/00 438/720 |
| 7,846,846 B2 | 12/2010 | Bera et al. | |
| 9,378,971 B1 | 6/2016 | Briggs et al. | |
| 9,543,158 B2 | 1/2017 | Hudson et al. | |

(Continued)

FOREIGN PATENT DOCUMENTS

| | | |
|---|---|---|
| CN | 112133676 A * | 12/2020 |
| JP | 2003 059918 | 2/2003 |

(Continued)

OTHER PUBLICATIONS

Machine translation CN112133676 (Year: 2020).*

(Continued)

*Primary Examiner* — Allan W. Olsen
(74) *Attorney, Agent, or Firm* — Yan Jiang

(57) ABSTRACT

Disclosed are methods for forming a high aspect ratio (HAR) structure during a HAR etch process in a substrate in a reaction chamber, the method comprising:
- sequentially or simultaneously exposing the substrate to a vapor of an etchant including a hydrofluorocarbon or fluorocarbon compound and an additive compound, the substrate having a film disposed thereon and a pattered mask layer disposed on the film;
- activating a plasma to produce an activated hydrofluorocarbon or fluorocarbon compound and an activated additive compound; and
- allowing an etching reaction to proceed between the film uncovered by the patterned mask layer and the activated hydrofluorocarbon or fluorocarbon compound and the activated additive compound to selectively etch the film from the patterned mask layer, thereby forming the HAR patterned structure.

15 Claims, 10 Drawing Sheets

(56) References Cited

U.S. PATENT DOCUMENTS

| | | | |
|---|---|---|---|
| 9,673,058 | B1 | 6/2017 | Briggs et al. |
| 9,997,372 | B2 | 6/2018 | Briggs et al. |
| 10,170,324 | B2 | 1/2019 | Dole et al. |
| 10,361,092 | B1 | 7/2019 | Roberts et al. |
| 10,741,407 | B2 | 8/2020 | Dole et al. |
| 2005/0189315 | A1* | 9/2005 | Knight ............... H01S 5/12 216/2 |
| 2007/0049018 | A1* | 3/2007 | Sandhu ............ H01L 21/76802 438/672 |
| 2009/0081876 | A1* | 3/2009 | Bera ............... H01J 37/32137 438/712 |
| 2011/0059617 | A1* | 3/2011 | Mitchell ........... H01J 37/32357 438/723 |
| 2014/0077126 | A1 | 3/2014 | Benson et al. |
| 2015/0294880 | A1* | 10/2015 | Anderson ............... C07C 19/08 438/719 |
| 2016/0307764 | A1* | 10/2016 | Gupta .................. C07C 323/03 |
| 2017/0178923 | A1 | 6/2017 | Surla et al. |
| 2018/0286707 | A1 | 10/2018 | Hudson et al. |
| 2019/0131140 | A1* | 5/2019 | Sun ...................... C09K 13/00 |
| 2019/0326129 | A1 | 10/2019 | Anderson et al. |
| 2021/0082709 | A1 | 3/2021 | Tomura et al. |
| 2021/0242032 | A1 | 8/2021 | Colinjivadi et al. |
| 2021/0407817 | A1* | 12/2021 | Marchegiani ....... H01L 21/3086 |
| 2023/0377953 | A1* | 11/2023 | Murakami ............ C23C 16/345 |

FOREIGN PATENT DOCUMENTS

| | | | |
|---|---|---|---|
| JP | 2003059918 A | * | 2/2003 |
| JP | 3961247 B2 | * | 8/2007 |
| JP | 2020 515047 | | 5/2020 |
| WO | WO 2018 126206 | | 7/2018 |
| WO | WO 2019 089766 | | 5/2019 |

OTHER PUBLICATIONS

L. Fan et al., A simple strategy to enhance electrical conductivity of nanotube-conjugate polymer composites via iodine-doping, RSC Adv., 2015, 5, 78104-78109.

J.K. Kim et al., Study on contact distortion during high aspect ratio contact $SiO_2$ etching, J. Vac. Sci. Technol. A, vol. 33, 021303-5 (2015).

J.-X. Lin et al., Iodine uptake and enhanced electrical conductivity in a porous coordination polymer based on cucurbit[6]uril, Inorganic Chemistry Frontiers, 2013, 00, 1-3.

N. Negishi et al., Bottom profile degradation mechanism in high aspect ratio feature etching based on pattern transfer observation, J. Vac. Sci. Technol. B, vol. 35, 051205 (2017).

I.W. Rangelow, Invited paper: Critical tasks in high aspect ratio silicon dry etching for microelectromechanical systems, J. Vac. Sci. Technol. A 21(4), Jul./Aug. 2003 1550-1562.

K.P. Singh et al., Iodine-treated heteroatom-doped carbon: conductivity driven electrocatalytic activity, J. Mater. Chem., 2014, 2, 18115.

M. Wang et al., Plasma etching of extremely high aspect ratio features: twisting effects, 60$^{th}$ Gaseous Electronics Conference, Oct. 2-5, 2007, Arlington, VA, 27 pages.

International Search Report and Written Opinion for corresponding PCT/US2021/063683, Mar. 2, 2022.

D.M. Manos and D.L. Flamm, editors, Plasma Etching: An introduction, Plasmas, Materials interactions, 1989, Academic Press, Inc., San Diego, CA, 12-13.

* cited by examiner

HIGH CONDUCTIVE PASSIVATION LAYERS AND METHOD OF FORMING THE SAME DURING HIGH ASPECT RATIO PLASMA ETCHING

TECHNICAL FIELD

Disclosed are methods for forming a high conductive sidewall passivation layer on sidewalls using etching gas as an additive by doping with Si, C, and/or iodine elements and/or introducing cyclic, aromatic, heterocyclic chemical structures during high aspect ratio (HAR) plasma etch.

BACKGROUND

For over 50 years, Moore's Law drives semiconductor manufacturers continuously to shrink device feature sizes to increase the speed and capability of transistor/chips while maintaining a cost advantage over their competition. This brings new challenges in fabrication processes to successfully meet the demands of the ever-shrinking size and dramatically increasing aspect ratio of the features. For example, the fabrication of three-dimensional gate stack NAND flash memory (3D-NAND) requires the ability to etch small hole features through 90+ NAND layers with an aspect ratio greater than 40. More than a trillion holes need to be etched on every wafer using extreme high aspect ratio (HAR) etch.

A vertical isotropy of etched features is obtained by ion transport during plasma sheath formation. In principle, positive and negative particles should have the same trajectories inside a hole and equalize the charge at the HAR hole bottom. But due to electron shading effect, charge build-up at the bottom of HAR mask patterns, which can lead to incomplete etching, bowing, twisting, and critical dimension (CD) variation between the top and bottom of the HAR stack. Therefore, lots of efforts were made by industry and are continuing to get rid of or minimize the sidewall charge-up during HAR etching, to improve the etch profile and CD control.

Contact hole distortion is known to be caused by an asymmetric charging of the contact hole sidewall, which changes the local electric field in the contact hole and alters the direction of the reactive ions in the contact hole (see Kim et al., J. Vac. Sci. Technol. A, Vol. 33, 021303-5 (2015) and Negishi et al, J. Vac. Sci. Technol. B, Vol. 35, 051205 (2017)). In HAR etch, ellipticity has been used to evaluate mask degradation. Higher ellipticity (close to 100%) may help avoid HAR hole twisting and reduce etch profile distortion.

Below are some examples of methods have been used to tune the passivation layer properties during HAR etch, while the consequence that follows naturally are 1) increased complexity of the gas/chemical delivery setup to the process chamber; 2) poor uniformity of passivation layer at the top and bottom HAR features; 3) chamber cleaning issue—some metal containing polymer deposited on the chamber wall, which are hard to be removed completely etc.

US 20070049018 to Sandhu et al. discloses a method of HAR contact etching a substantially vertical contact hole in an oxide layer using a hard photo resist mask is described. The plasma etch gas is a hydrocarbon fluoride comprises one of $CH_2F_2$, $C_4F_8$; $C_3H_3F_5$, $C_4F_8$; $CHF_3$; $C_2F_6$; $C_2HF_5$, $CH_3F$, or combinations thereof. The dopant molecule comprises one of HI, $CH_3I$, carbon, potassium, calcium, $PF_6$, $BF_3$, chloride, $AsF_6$ or combinations thereof. The doped plasma etching gas etches a substantially vertical contact hole through the oxide layer by doping carbon chain polymers formed along the sidewalls of the contact holes during the etching process into a conductive state. The conductive state of the carbon chain polymers reduces the charge buildup along sidewalls to prevent twisting of the contact holes by bleeding off the charge and ensuring proper alignment with active area landing regions. The etching stops at the underlying Substrate.

U.S. Pat. No. 7,846,846B2 to Bera et al. discloses a method of etching HAR contact openings while preventing bowing or bending of the etch profile by forming a highly conductive thin film on the side wall of each contact opening. The conductivity of the thin film on the side wall is enhanced by ion bombardment carried out periodically during the etch process. The etchant is a fluorocarbon/fluorohydrocarbon gas comprising at least one of $C_2F_4$, $C_4F_6$, $CH_2F_2$ or $C_4F_8$, $C_1$ to $C_5$ saturated or unsaturated linear, branched, cyclic hydrofluorocarbons, such as $C_4H_2F_6$, $CHF_3$, $CH_2F_2$, or combinations thereof.

U.S. Pat. No. 9,543,158 to Nikhil et al. discloses various methods, apparatus and systems for forming a recessed feature in dielectric material on a substrate. In some cases the protective coating is deposited using plasma assisted atomic layer deposition, a modified plasma assisted atomic layer deposition, or plasma assisted chemical vapor deposition. The etch chemistry is a combination of fluorocarbons and oxygen, $C_4F_6$, $C_4F_3$, $N_2$, CO, $CF_4$, and $O_2$. The protective layer is ceramic material or an organic polymer. For boron containing materials, such as boron oxides (BxOy) and boron nitrides (BxNy), the reactants include, but are not limited to, triisopropyl borate $([(CH_3)_2CHO]_3B)$, trimethyl-boron-$d_9$ $(B(CD_3)_3)$, etc. For silicon containing materials, such as silicon oxides $(Si_xO_y)$ and silicon nitrides $(Si_xN_y)$, the reactant may be, for example, a silane, a halosilane or an aminosilane.

The HAR etching process became a key process for memory devices. Ion energy control by increasing the effective bias power for HAR features continues to advance. Great effort was made to increase ion energies to overcome charge build-up on the etching front inside HAR holes. Based on the trend of bias power in the past few years, the required power currently would exceed 20 kW. Many challenges arise when the bias power is increased. The prevention of arcing and effective cooling, and power delivery systems are all critical for enabling high-power capability. Moreover, it is harder to compensate for neutral fluxes with increasing aspect ratio, because the neutral species are transferred only by diffusion through the holes.

Thus, there is a demand to achieve a high conductive sidewall passivation layer with a reduced the bias power.

SUMMARY

Disclosed are methods for forming a high aspect ratio (HAR) structure during a HAR etch process in a substrate in a reaction chamber, the method comprising:

sequentially or simultaneously exposing the substrate to a vapor of an etchant including a hydrofluorocarbon or fluorocarbon compound and an additive compound, the substrate having a film disposed thereon and a patterned mask layer disposed on the film;

activating a plasma to produce an activated hydrofluorocarbon or fluorocarbon compound and an activated additive compound; and allowing an etching reaction to proceed between the film uncovered by the patterned mask layer and the activated hydrofluorocarbon or fluorocarbon compound and the activated additive compound to selectively etch the film from the patterned mask layer, thereby forming the HAR patterned structure. The disclosed methods may include one or more of the following aspects:

further comprising the step of introducing an oxidizer into the reaction chamber, wherein the oxidizer is selected from $O_2$, $O_3$, CO, $CO_2$, NO, $N_2O$, $NO_2$, $H_2O$, $H_2O_2$, COS, $SO_2$ and combinations thereof;

the oxidizer being $O_2$;

the oxidizer being $O_3$;

the oxidizer being CO;

mixing the etching compound, the additive and the oxygen containing gas prior to introduction to the chamber to produce a mixture;

introducing the etching compound and the additive separately from the oxygen containing gas;

introducing the oxygen containing gas continuously and introducing the iodine-containing etching compound;

the oxygen containing gas comprising approximately 0.01% v/v to approximately 99.9% v/v of a total volume of the etching compound, the additive and oxygen containing gas;

the oxygen containing gas comprising approximately 0.01% v/v to approximately 10% v/v of a total volume of the etching compound, the additive and oxygen containing gas;

comprising the step of introducing an inert gas into the reaction chamber, wherein the inert gas is selected from the group consisting of He, Ar, Xe, Kr, Ne and $N_2$;

the inert gas being Ar;

the inert gas being Xe;

the inert gas being Kr;

mixing the etching compound, the additive and the inert gas prior to introduction to the chamber to produce a mixture;

introducing the etching compound and the additive separately from the inert gas;

introducing the inert gas continuously and introducing the etching compound and the additive in pulses;

the inert gas comprising approximately 0.01% v/v to approximately 99.9% v/v of a total volume of the vapor of the etching compound, the additive and inert gas;

the inert gas comprising approximately 90% v/v to approximately 99% v/v of a total volume of the vapor of the etching compound, the additive and inert gas;

the substrate being a Si wafer;

the substrate being a crystalline silicon layer forming the patterned structure;

the patterned structure being 3D NAND apertures;

the patterned structure being contact holes;

the patterned structure being 3D NAND contact holes;

the patterned structure being DRAM contact;

the patterned structure being channel holes;

the patterned structure being 3D NAND channel holes;

the patterned structure being 3D NAND slit contact;

the aperture being staircase contacts;

the aperture being self-aligned contact;

the aperture being self-aligned vias;

the aperture being super vias;

the plasma activated fluorocarbon compound and activated additive compound reacting with the film to form volatile by-products;

the volatile by-products being removed from the reaction chamber;

a high conductive sidewall passivation layer being formed on sidewalls of the HAR patterned structure;

a conductivity of the high conductive sidewall passivation layer formed with the activated hydrofluorocarbon or fluorocarbon compound and the activated additive compound being at least approximately 10% higher than the conductivity of the high conductive sidewall passivation layer formed with the activated hydrofluorocarbon or fluorocarbon compound without the addition of the activated additive compound;

the hydrofluorocarbon or fluorocarbon compound including $CF_4$, $CH_3F$, $C_2F_6$, $C_3F_8$, $C_2HF_5$, $C_5F_8$, $C_6F_6$, $C_4F_6$, $C_4F_8$, $C_1$ to $C_5$ saturated or unsaturated linear, branched, cyclic hydrofluorocarbons, such as $C_4H_2F_6$, $CHF_3$, $CH_2F_2$, or combinations thereof;

the hydrofluorocarbon or fluorocarbon compound being $C_4H_2F_6$;

the additive compound contains silicon, carbon and/or iodine elements having the following formula:

$C_nR^1R^2R^3I$, $SiR^1R^2R^3I$, $SiR^1R^2I_xF_{(2-x)}$, $SiRI_y F_{(3-y)}$, $SiI_z F_{(4-z)}$, or $C_nF_{(2n+1)}I$ wherein n=1 to 10; x=1-2; y=1-3; z=1-3; R, $R^1$, $R^2$ and $R^3$ each are independently selected from H, $C_1$-$C_{10}$ linear, branched or cyclic, saturated or unsaturated, aromatic, heterocyclic, partially or fully fluorinated, substituted or unsubstituted alkyl groups; $R^1$ and $R^2$, $R^2$ and $R^3$ or R and $R^3$ may also be linked to form a cyclic group;

the additive compound being selected from

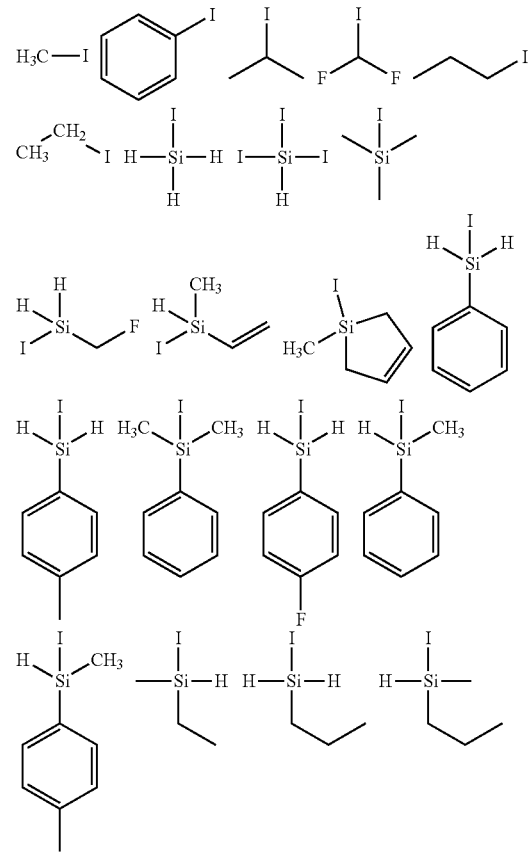

-continued
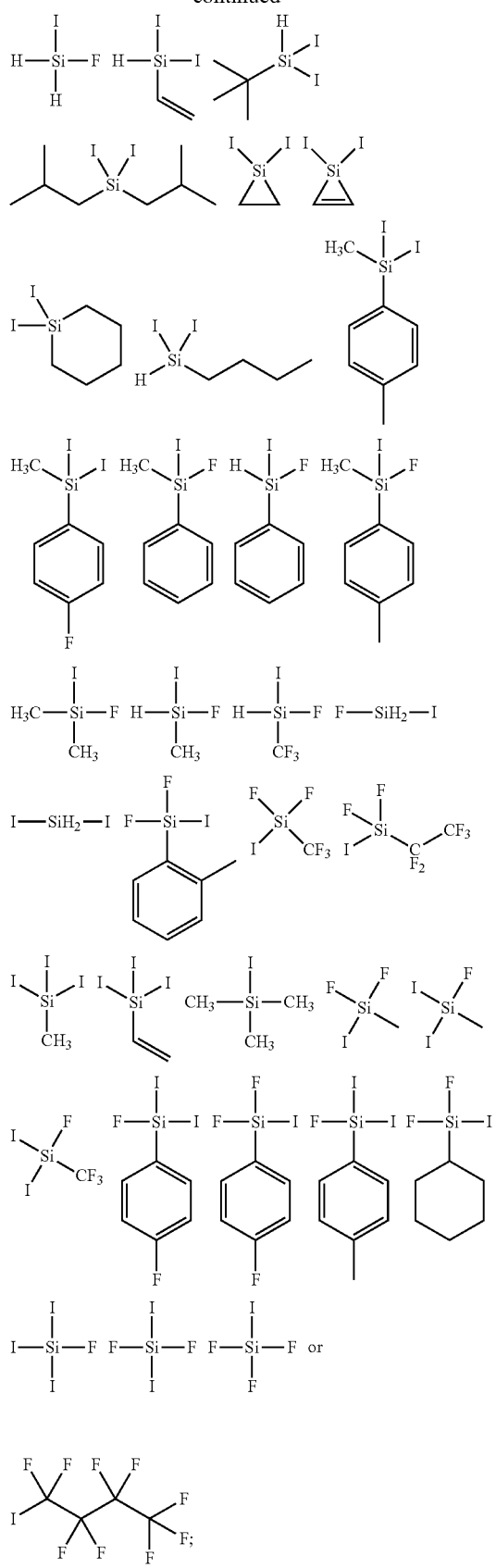
the disclosed additives $CR^1R^2R^3I$ above including
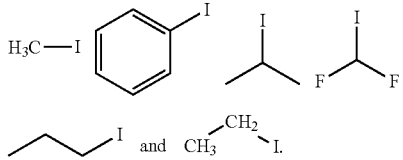
the disclosed additives $SiR^1R^2R^3I$ above including
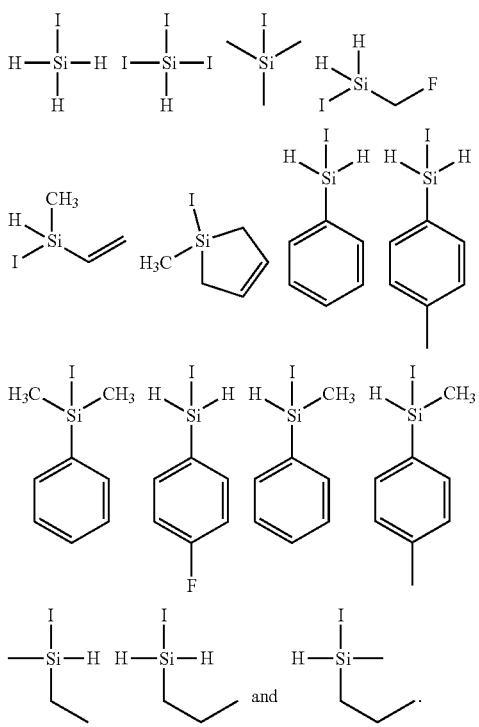
the disclosed additives $SiR^1R^2I_xF_{(2-x)}$ above including
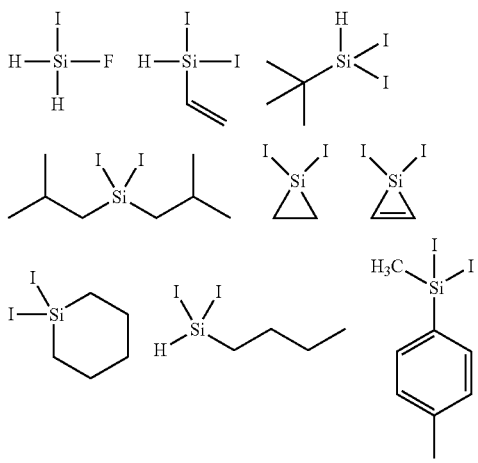

-continued

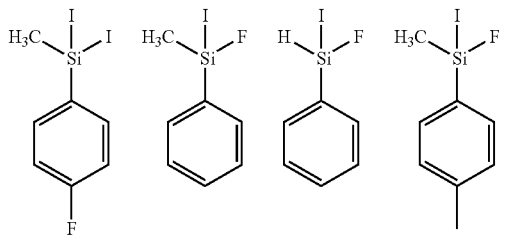

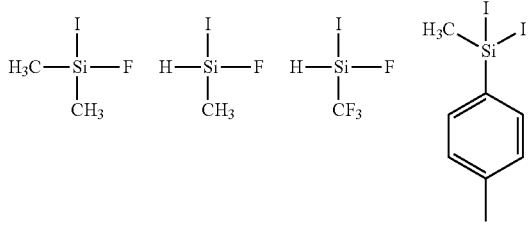

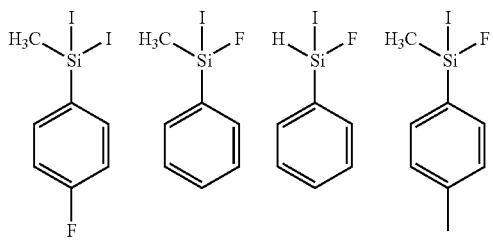

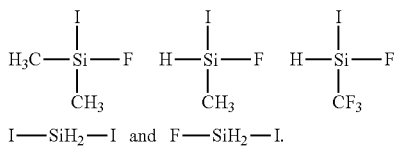

the disclosed additives SiRI$_y$F$_{(3-y)}$ above including

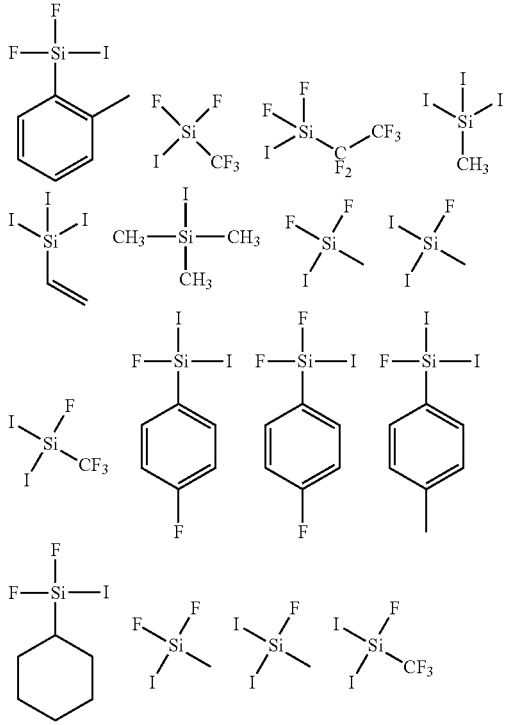

-continued

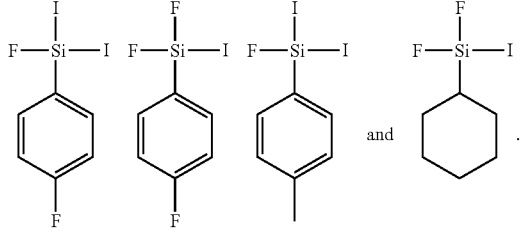 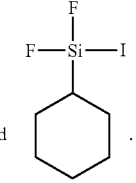

and the disclosed additives SiI$_z$F$_{(4-z)}$ above including

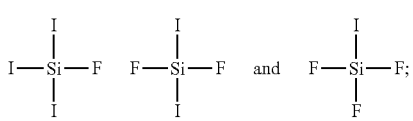

the disclosed additives C$_n$F$_{(2n+1)}$I including

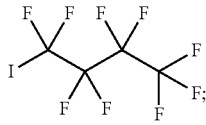 [SMILES: FC(F)(F)C(F)(F)C(F)(F)C(F)(F)I]

the additive compound being selected from
Iodo-methane CH$_3$I (CAS No.: 74-88-4),
Iodo-benzene C$_6$H$_5$I (CAS No.: 591-50-4),
2-iodopropane C$_3$H$_7$I (CAS No.: 75-30-9),
1-Iodopropane C$_3$H$_7$I (CAS No.: 107-08-4),
1-iodoethane C$_2$H$_5$I (CAS No.: 75-03-6),
Perfluorobutyl iodide C$_4$F$_9$I (CAS No.: 423-39-2),
Difluoroiodomethane CHIF$_2$ (CAS No.: 1493-03-4),
Difluoroiodo(pentafluoroethyl)-silane C$_2$F$_7$ISi (CAS No.: 36972-59-5),
1-(difluoroiodosilyl)-2-methyl-benzene C$_7$H$_7$F$_2$ISi (CAS No.: 174711-76-3),
Difluoroiodo(trifluoromethyl)-silane CF$_5$ISi (CAS No.: 27668-68-4),
Triethyliodo-silane C$_6$H$_{15}$ISi (CAS No.: 1112-49-8),
Fluorotriiodo-silane FI$_3$Si (CAS No.: 16865-60-4),
Bifluorobiiodo-silane F$_2$I$_2$Si (CAS No.: 27669-15-4),
Trifluoroiodo-silane F$_3$ISi (CAS No.: 27668-68-4),
Iodotrimethyl-silane C$_3$H$_9$ISi (CAS No.: 16029-98-4), or
Diiodosilane SiH$_2$I$_2$ (CAS No.: 13760-02-6);
the additive compound being Iodo-methane CH$_3$I (CAS No.: 74-88-4);
the additive compound being Iodo-benzene C$_6$H$_5$I (CAS No.: 591-50-4);
the additive compound being 2-iodopropane C$_3$H$_7$I (CAS No.: 75-30-9);
the additive compound being 1-Iodopropane C$_3$H$_7$I (CAS No.: 107-08-4);
the additive compound being 1-iodoethane C$_2$H$_5$I (CAS No.: 75-03-6;
the additive compound being Perfluorobutyl iodide C$_4$F$_9$I (CAS No.: 423-39-2);
the additive compound being Difluoroiodomethane CHIF$_2$ (CAS No.: 1493-03-4);
the additive compound being Difluoroiodo(pentafluoroethyl)-silane C$_2$F$_7$ISi (CAS No.: 36972-59-5);
the additive compound being Difluoroiodo(pentafluoroethyl)-silane C$_2$F$_7$ISi (CAS No.: 36972-59-5);

the additive compound being 1-(difluoroiodosilyl)-2-methyl-benzene $C_7H_7F_2ISi$ (CAS No.: 174711-76-3);

the additive compound being Difluoroiodo(trifluoromethyl)-silane $CF_5ISi$ (CAS No.: 27668-68-4);

the additive compound being Triethyliodo-silane $C_6H_{15}Si$ (CAS No.: 1112-49-8);

the additive compound being Fluorotriiodo-silane $FI_3Si$ (CAS No.: 16865-60-4);

the additive compound being Bifluorobiiodo-silane $F_2I_2Si$ (CAS No.: 27669-15-4);

the additive compound being Trifluoroiodo-silane $F_3ISi$ (CAS No.: 27668-68-4);

the additive compound being Iodotrimethyl-silane $C_3H_9ISi$ (CAS No.: 16029-98-4);

the additive compound being Diiodosilane $SiH_2I_2$ (CAS No.: 13760-02-6);

the film being a silicon-containing film that contains O and/or N and optionally contains dopants such as B, C, P, As Ga, In, Sn, Sb, Bi and/or Ge, and combinations thereof;

the film being a silicon-containing film that contains O;

the film being a silicon-containing film that contains N;

the film being a silicon-containing film that optionally contains dopants such as B, C, P, As Ga, In, Sn, Sb, Bi and/or Ge, and combinations thereof;

the silicon-containing film being comprising a layer of silicon oxide (SiO), silicon nitride (SiN), crystalline Si, poly-silicon (p-Si), polycrystalline silicon, amorphous silicon, low-k SiCOH, SiOCN, SiC, SiON and $Si_aO_bH_cC_dN_e$, where a>0; b, c, d and e≥0, alternating SiO and SiN (ONON) layers, alternating SiO and p-Si (OPOP) layers;

the silicon-containing film comprising oxygen, nitrogen, carbon, hydrogen, or combinations there, the silicon-containing film being $SiO_xN_yH_zC_k$, wherein x ranges from 0 to 2, y ranges from 0 to 4, z ranges from 0 to about 1 and k ranges from 0 to 1;

the silicon-containing film comprising a SiO layer, the silicon-containing film being a SiN layer;

the silicon-containing film comprising alternating SiO and SiN (ONON) layers;

the silicon-containing film comprising alternating SiO and p-Si (OPOP) layers;

the silicon-containing film comprising dopants such as B, C, P, As Ga, In, Sn, Sb, Bi and/or Ge;

the alternating layers comprising a layer of silicon oxide, silicon nitride, polysilicon, crystalline silicon, SiOCH, SiON, $Si_aO_bC_cN_dH_e$ (where a>0; b, c, d and e≥0) or combinations thereof;

the alternating layers comprising oxygen atoms, nitrogen atoms, carbon atoms, hydrogen atoms or combinations thereof;

the alternating layers being a silicon containing film;

the alternating layers comprising a layer of silicon oxide and a layer of silicon nitride;

the alternating layers comprising alternating layers of silicon oxide and silicon nitride;

the alternating layers being alternating layers of silicon oxide and silicon nitride;

the alternating layers comprising a layer of silicon oxide and a layer of polysilicon;

the alternating layers comprising alternating layers of silicon oxide and polysilicon;

the alternating layers being alternating layers of silicon oxide and polysilicon;

the alternating layers being selectively etched from the hardmask layer, the alternating layers being selectively etched from an a-C layer;

the alternating layers being selectively etched from a doped carbon layer;

the alternating layers of silicon oxide and silicon nitride being selectively etched from an a-C layer;

the alternating layers of silicon oxide and silicon nitride being selectively etched from a doped carbon layer;

the alternating layers of silicon oxide and polysilicon being selectively etched from an a-C layer;

the alternating layers of silicon oxide and polysilicon being selectively etched from a doped carbon layer;

the silicon oxide layer being selectively etched from the hardmask layer;

the silicon oxide layer being selectively etched from an a-C layer;

the silicon oxide layer being selectively etched from a doped carbon layer;

the silicon nitride layer being selectively etched from the hardmask layer;

the silicon nitride layer being selectively etched from an a-C layer;

the silicon nitride layer being selectively etched from a doped carbon layer;

the polysilicon layer being selectively etched from the hardmask layer;

the polysilicon layer being selectively etched from an a-C layer;

the polysilicon layer being selectively etched from a doped carbon layer;

the silicon-containing film being selectively etched from an amorphous carbon layer, a doped amorphous carbon layer, a photoresist layer, an anti-reflective layer or organic planarization layer;

the silicon oxide layer is selectively etched from an amorphous carbon layer, a doped amorphous carbon layer, a photoresist layer, an anti-reflective layer or organic planarization layer;

the etching compound etching both the silicon oxide layer and the silicon nitride layer with high etch rates;

the patterned mask layer being an a-C layer, a doped a-C layer, a photoresist layer, an anti-reflective layer, an organic planarization layer, a poly-Si layer, a metal oxide layer such as Ti, Al, Zr, Hf, etc. oxide, and combinations thereof;

a hardmask layer being disposed on the silicon-containing layer;

the hardmask layer being a patterned hardmask layer;

the hardmask layer being an amorphous carbon layer, a doped amorphous carbon layer, a photoresist layer, an anti-reflective layer, an organic planarization layer or combinations thereof;

the hardmask layer being a layer of CVD, PECVD, ALD, PEALD or spin on deposited (SOD) amorphous carbon or doped amorphous carbon, silicon-containing spin on mask, or carbon-containing spin on mask;

the hardmask layer being an amorphous carbon (a-C) layer;

the hardmask layer being a doped carbon layer, the doped amorphous carbon layer being a boron-doped a-C layer;

the doped amorphous carbon layer being a tungsten-doped a-C layer;

the HAR patterned structure formed in the film having an aspect ratio between approximately 1:1 and approximately 200:1;

the HAR patterned structure formed in the film having an aspect ratio between approximately 1:1 and approximately 20:1;

the HAR patterned structure formed in the film having an aspect ratio between approximately 21:1 and approximately 60:1;

the HAR patterned structure formed in the film having an aspect ratio between approximately 21:1 and approximately 200:1;

the HAR patterned structure formed in the film having an aspect ratio between approximately 61:1 and approximately 200:1;

further comprising introducing an additional etch gas into the reaction chamber, wherein the additional etch gas is selected from the group consisting of $cC_4F_8$, $C_4F_8$, $cC_5F_8$, $C_5F_8$, $C_4F_6$, $CF_4$, $CH_3F$, $CF_3H$, $CH_2F_2$, $C_3HF_7$, $C_3F_6$, $C_3H_2F_6$, $C_3H_2F_4$, $C_3H_3F_5$, $C_4HF_7$, $C_5HF_9$, $C_3F_6$, $C_3F_8$, $CF_3I$, $C_2F_3I$, $C_2F_5I$, $C_3F_7I$, 1-Iodoheptafluoropropane (1-$C_3F_7I$), 2-Iodoheptafluoropropane (2-$C_4F_7I$), $C_3HF_7$, COS, FNO, F—C≡N, $CS_2$, $SO_2$, $SF_6$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), and cis-1,1,2,2,3,4-hexafluorocyclobutane (cis-$C_4H_2F_6$), and combinations thereof;

introducing the etching compound and the additive separately from the additional etch gas;

adding approximately 0.01% v/v to approximately 99.99% v/v of the additional etch gas to the etching compound and the additive;

activating the plasma by applying RF power;

activating the plasma by a RF power ranging from approximately 25 W to approximately 100,000 W;

the bias power being low by using the additives with the hydrofluorocarbons or fluorocarbons, comparing to the etching without additives;

the bias power being lower at least approximately 10% by using the additives with the hydrofluorocarbons or fluorocarbons than the case without using the additives;

etching pressure ranging from approximately 1 mTorr to approximately 100 Torr;

etching pressure ranging from approximately 1 mTorr to approximately 50 Torr;

etching pressure ranging from approximately 1 mTorr to approximately 10 Torr;

etching pressure ranging from approximately 1 mTorr to approximately 50 mTorr;

introducing the vapor of the etching compound and the additive at a flow rate ranging from approximately 0.1 scam to approximately 1 slm;

introducing the vapor of the etching compound at a flow rate ranging from approximately 0.1 sccm to approximately 1 slm;

introducing the vapor of the additive at a flow rate ranging from approximately 0.1 sccm to approximately 1 slm;

maintaining the substrate at a temperature ranging from approximately −100° C. to approximately 500° C.;

maintaining the substrate at a temperature ranging from approximately 20° C. to approximately 150° C.;

maintaining the substrate at a temperature ranging from approximately 20° C. to approximately 110° C.; and measuring the etching compound under plasma by Quadrupole mass spectrometer, optical emission spectrometer, FTIR, or other radical/ion measurement tool.

Also disclosed are methods for forming a HAR patterned structure, the method comprising the steps:

sequentially or simultaneously exposing the substrate to a vapor of $C_4H_2F_6$ and $CH_3I$, the substrate having a film disposed thereon and a patterned mask layer disposed on the film;

activating a plasma to produce an activated $C_4H_2F_6$ and an activated $CH_3I$; and allowing an etching reaction to proceed between the film uncovered by the patterned mask layer and the activated $C_4H_2F_6$ and the $CH_3I$ to selectively etch the film from the patterned mask layer, thereby forming the HAR patterned structure. The disclosed methods may include one or more of the following aspects:

further comprising the step of introducing an oxidizer into the reaction chamber, wherein the oxidizer is selected from $O_2$, $O_3$, CO, $CO_2$, NO, $N_2O$, $NO_2$, $H_2O$, $H_2O_2$, COS, $SO_2$ and combinations thereof;

further comprising the step of introducing an inert gas into the reaction chamber, wherein the inert gas is selected from the group consisting of He, Ar, Xe, Kr, Ne and $N_2$;

a high conductive sidewall passivation layer being formed on sidewalls of the HAR patterned structure;

a conductivity of the high conductive sidewall passivation layer formed with the activated $C_4H_2F_6$ and the activated $CH_3I$ being at least approximately 10% higher than the conductivity of the high conductive sidewall passivation layer formed with the activated $C_4H_2F_6$ without the addition of the activated $CH_3I$;

the HAR patterned structure formed in the film having an aspect ratio between approximately 1:1 and approximately 200:1;

further comprising introducing an additional etch gas into the reaction chamber, wherein the additional etch gas is selected from the group consisting of $cC_4F_8$, $C_4F_8$, $cC_5F_8$, $C_5F_8$, $C_4F_6$, $CF_4$, $CH_3F$, $CF_3H$, $CH_2F_2$, $C_3HF_7$, $C_3F_6$, $C_3H_2F_6$, $C_3H_2F_4$, $C_3H_3F_5$, $C_4HF_7$, $C_5HF_9$, $C_3F_6$, $C_3F_8$, $CF_3I$, $C_2F_3I$, $C_2F_5I$, $C_3F_7I$, 1-Iodoheptafluoropropane (1-$C_3F_7I$), 2-Iodoheptafluoropropane (2-$C_3F_7I$), $C_3HF_7$, COS, FNO, F—C≡N, $CS_2$, $SO_2$, $SF_6$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), and cis-1,1,2,2,3,4-hexafluorocyclobutane (cis-$C_4H_2F_6$), and combinations thereof; and the film being a silicon-containing film that contains O and/or N and optionally contains dopants such as B, C, P, As Ga, In, Sn, Sb, Bi and/or Ge, and combinations thereof.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "wafer" or "patterned wafer" refers to a wafer having a stack of any existing films including silicon-containing films on a substrate and a pattered hardmask layer on the stack of any existing films including silicon-containing films formed for pattern etch.

The term "substrate" refers to a material or materials on which a process is conducted. The substrate may refer to a wafer or a patterned wafer having a material or materials on which an etching process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, indium, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.), nitride-based films (for example, TaN, TiN, NbN) that are used as electrodes, or metal-containing or metal-alloy-based films (for example, InGaAs, $In_xO_y$ (x=0.5 to 1.5, y=0.5 to 1.5), InSnO (ITO), InGaZnO (IGZO), InN, InP, InAs, InSb, $In_2S_3$, or $In(OH)_3$, etc.) that are the stronger contenders for the future replacement of silicon in CMOS systems. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "pattern etch" or "pattered etch" refers to etching a non-planar structure, such as a stack of silicon-containing films below a patterned hardmask layer.

As used herein, the term "etch" or "etching" means to use an etching compound and/or a plasma to remove material via ion bombardment, remote plasma, or chemical vapor reaction between the etching gas and substrate and refers to an isotropic etching process and/or an anisotropic etching process. The isotropic etch process involves a chemical reaction between the etching compound and the substrate resulting in part of material on the substrate being removed. This type of etching process includes chemical dry etching, vapor phase chemical etching, thermal dry etching, or the like. The isotropic etch process produces a lateral or horizontal etch profile in a substrate. The isotropic etch process produces recesses or horizontal recesses on a sidewall of a pre-formed aperture in a substrate. The anisotropic etch process involves a plasma etching process (i.e., a dry etch process) in which ion bombardment accelerates the chemical reaction in the vertical direction so that vertical sidewalls are formed along the edges of the masked features at right angles to the substrate (Manos and Flamm, Thermal etching an Introduction, Academic Press, Inc. 1989 pp. 12-13). The plasma etching process produces a vertical etch profile in a substrate. The plasma etching process produces vertical vias, apertures, trenches, channel holes, gate trenches, staircase contacts, capacitor holes, contact holes, slit etch, self-aligned contact, self-aligned vias, super vias etc., in the substrate.

The term "mask" refers to a layer that resists etching. The mask layer may be located above the layer to be etched. The mask layer also refers to a hardmask layer. The mask layer may be an amorphous carbon (a-C) layer, a doped a-C layer, a photoresist layer, an anti-reflective layer, an organic planarization layer, and combinations thereof. The mask layer may also be a silicon layer, such as poly-Si, metal oxide such as Ti, Al, Zr, Hf, etc. oxide, and combinations thereof.

The term "aspect ratio" refers to a ratio of the height of a trench (or aperture) to the width of the trench (or the diameter of the aperture).

The term "etch stop" refers to a layer below the layer to be etched that protects layers underneath.

The term "device channel" refers to layers that are part of actual device and any damage to it will affect device performance.

The term "selectivity" means the ratio of the etch rate of one material to the etch rate of another material. The term "selective etch" or "selectively etch" means to etch one material more than another material, or in other words to have a greater or less than 1:1 etch selectivity between two materials.

The terms "via", "aperture", "trench", and "hole" are sometimes used interchangeably, and generally mean an opening in an interlayer insulator.

The term "low bias power" or "reduced bias power" refers to a bias power lower than a baseline process.

The term "additive" used herein refers to a compound or gas that is added to other etching compounds and provides some improving characteristics of the etch such as improving the profile characteristics, such as bowing, CD, ellipticity, etc.

The term "ellipticity" used herein refers to a method to measure mask degradation, where in an etch application, the ellipticity of the etched hole was estimated by (the short hole width/the long hole width)*100% for simplicity; therefore, the ellipticity of the complete circular shape was defined as 100%.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The term "mercury probe" used herein refers to an electrical probing device to make rapid, non-destructive contact to a sample for electrical characterization. If the mercury-sample contact is ohmic (non-rectifying) then current-voltage instrumentation may be used to measure resistance, leakage currents, or current-voltage characteristics. Resistance may be measured on bulk samples or on thin films. The thin films can be composed of any material that does not react with mercury. Diameter of the mercury contact of the mercury probe used herein is 760 um.

The term "conductivity" used herein is the reciprocal of electrical resistivity and represents the material's ability to conduct electric current. The unit of electrical conductivity used herein is Siemens per centimeter (S/cm). It is measured using a mercury probe and calculated from the current-voltage curve under the electrical field of 0.2 MV/cm using the solution of $$\sigma = \frac{I*T}{V*A},$$

where $\sigma$ is conductivity, I is current measured by mercury probe; T is thickness of the polymer; A is the contact area of the mercury probe. Electrical field is defined as applied voltage divided by polymer thickness. For example, in FIG. 10, when the electrical field is 0.2 MV/cm, the measured current is $1.92 \times 10^{-11}$ Amp. The conductivity of C4F8 polymer is calculated as $2.14 \times 10^{-9}$ S/cm.

The term "high conductive sidewall passivation layer" used herein refers to an electrical conductivity of the sidewall passivation layer above the conductivity of $C_4F_8$ polymer, which is calculated as $2.14 \times 10^{-9}$ S/cm.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "etching compound", "etchant", "etching gas" and "process gas" may be used interchangeably when the etching compound is in a gaseous state under room temperature and ambient pressure. It is understood that an etching compound may correspond to, or related to an etching gas or an etchant or a process gas, and that the etching gas or the etchant or the process gas may refer to the etching compound.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the silicon-containing films, such as SiN and SiO, are listed throughout the specification and claims without reference to their proper stoichiometry. The silicon-containing films may include pure silicon (Si) layers, such as crystalline Si, poly-silicon (p-Si or polycrystalline Si), or amorphous silicon; silicon nitride ($Si_kNl$) layers; or silicon oxide ($Si_nO_m$) layers; or mixtures thereof, wherein k, l, m, and n, inclusively range from 0.1 to 6. Preferably, silicon nitride is SiN, where k and l each range from 0.5 to 1.5. More preferably silicon nitride is $Si_3N_4$. Herein, SiN in the following description may be used to represent $Si_kNl$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As, Ga, In, Sn, Sb, Bi and/or Ge, and combinations thereof.

The term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where M is an atom, x is 2 or 3, the two or three $R^1$ groups may, but need not be identical to each other or to $R^2$ or to $R^3$. Further, it should be understood that unless specifically stated otherwise, values of R groups are independent of each other when used in different formulas.

Ranges may be expressed herein as from about one particular value, and/or to about another particular value. When such a range is expressed, it is to be understood that another embodiment is from the one particular value and/or to the other particular value, along with all combinations within said range.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
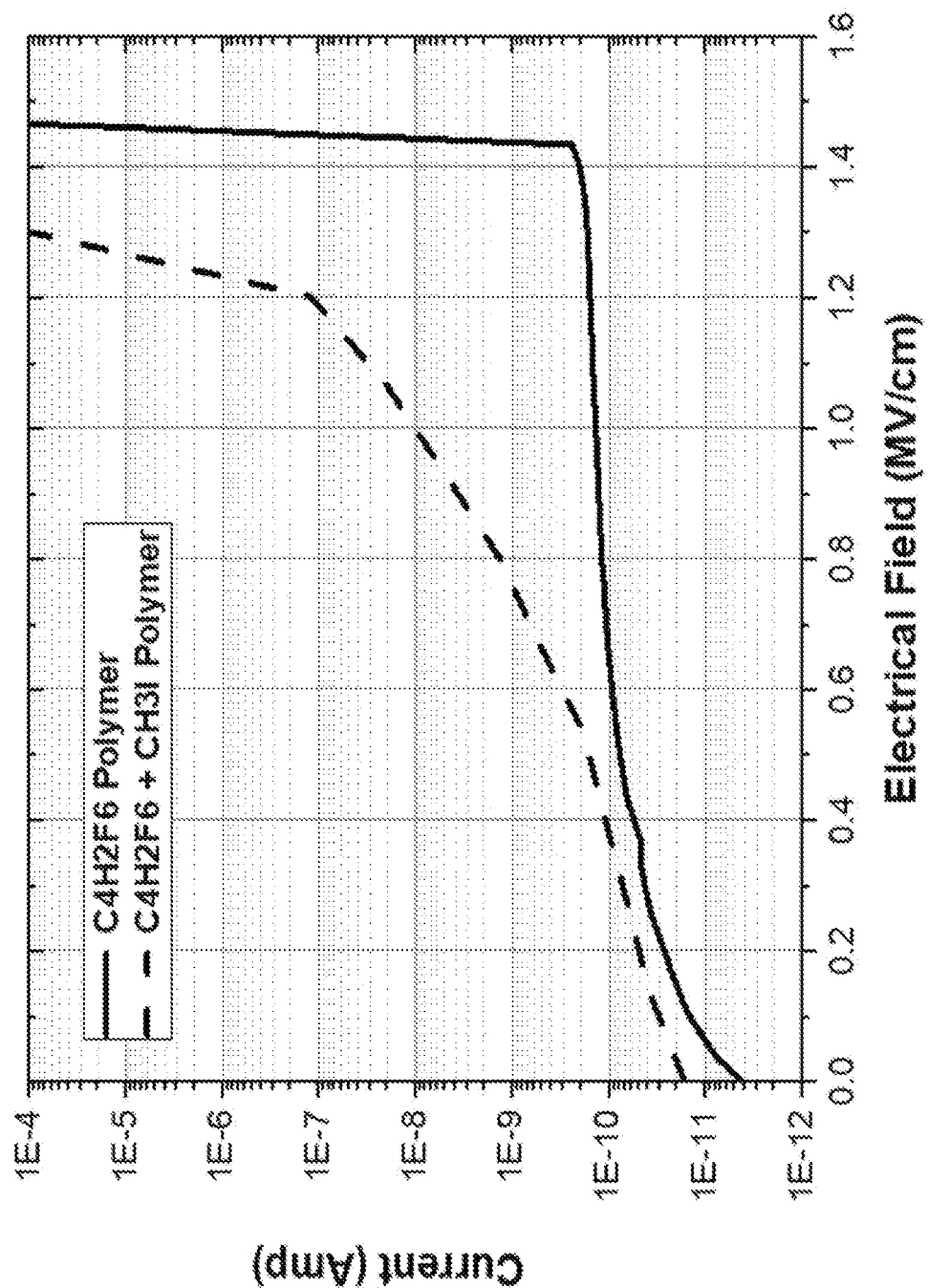
FIG. 1 is conductivity of $C_4H_2F_6$ with and without an additive $CH_3I$ measured on a planar wafer.

Disclosed are methods for forming a high conductive sidewall passivation layer on sidewalls using etching gas as an additive by doping with Si, C, and/or iodine elements in a high aspect ratio (HAR) plasma etch process. The disclosed methods use an additive or an additive chemical in the HAR plasma etch process to form the high conductive sidewall passivation layer by doping with Si, C, and/or iodine elements. The high conductive sidewall passivation layer may be a polymer passivation layer. The conductive state of the polymer passivation layer reduces the charge buildup along the sidewalls to prevent twisting of the HAR structures such as holes by bleeding off the charge and ensuring proper control of critical dimension (CD) variation at low bias power level or less to no bias power. By applying the additives, the bias power may be lower at least approximately 10% than the case without using the additives, or even no bias power is required.

The disclosed methods could also be considered as a low bias energy plasma etching, since with minimized sidewall charge, less plasma bias power is required for reactive ions to reach the bottom of HAR trench. In addition, the disclosed etching gases or processing gases including additives do not contain any hard-to-clean elements, which also minimize reaction chamber contaminations and reduce tool maintenance/down times.

The disclosed methods relate to plasma etching a patterned wafer or a substrate using a hydrofluorocarbon etchant gas and an additive gas under a reduced bias power for a predetermined time. The predetermined time may range from 0 s to 1000 s for stabilizing the pressure and gas flow in the chamber prior to activating a plasma.

The disclosed additives or additive chemicals contain Si, C, and/or iodine elements having the following formula:

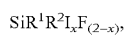

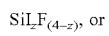, or

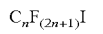

wherein x=1-2; y=1-3; z=1-4; R, $R^1$, $R^2$ and $R^3$ each are independently selected from H, D (Deuterium), $C_1$-$C_{10}$ linear, branched or cyclic, saturated or unsaturated, aromatic, heterocyclic, partially or fully fluorinated, substituted or unsubstituted alkyl groups. $R^1$ and $R^2$, $R^2$ and $R^3$ or $R^1$ and $R^3$ may also be linked to form a cyclic group.

The disclosed additives $CR^1R^2R^3I$ above may include

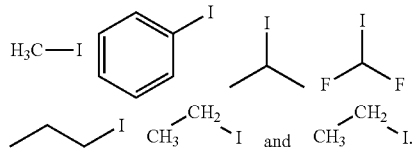

The disclosed additives $SiR^1R^2R^3I$ above may include

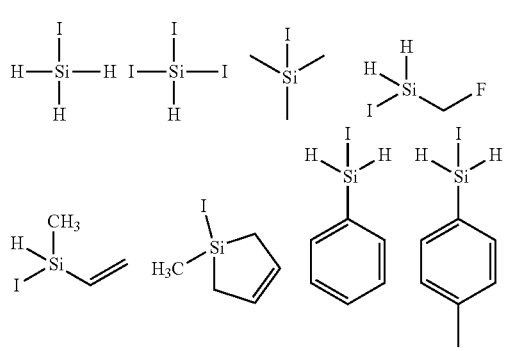

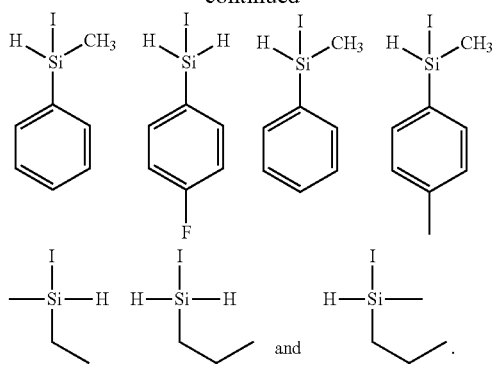

The disclosed additives $SiR^1R^2I_xF_{(2-x)}$ above may include

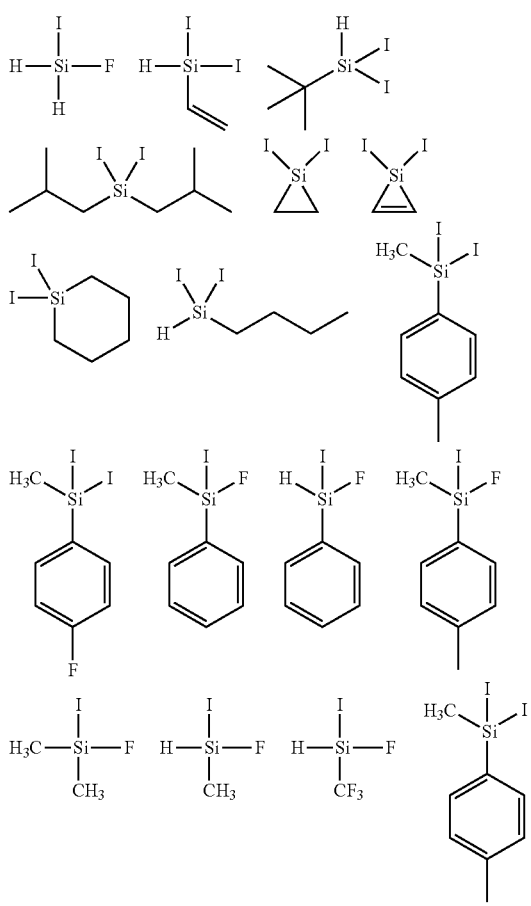

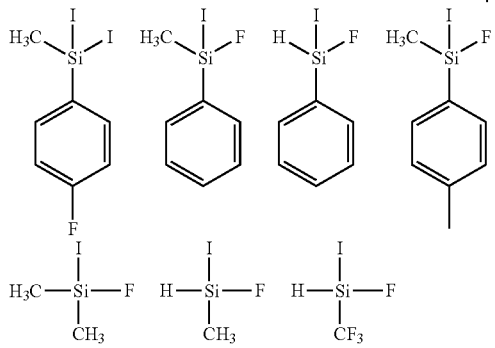

-continued

I—SiH₂—I  and  F—SiH₂—I.

The disclosed additives $SiRI_yF_{(3-y)}$ above may include

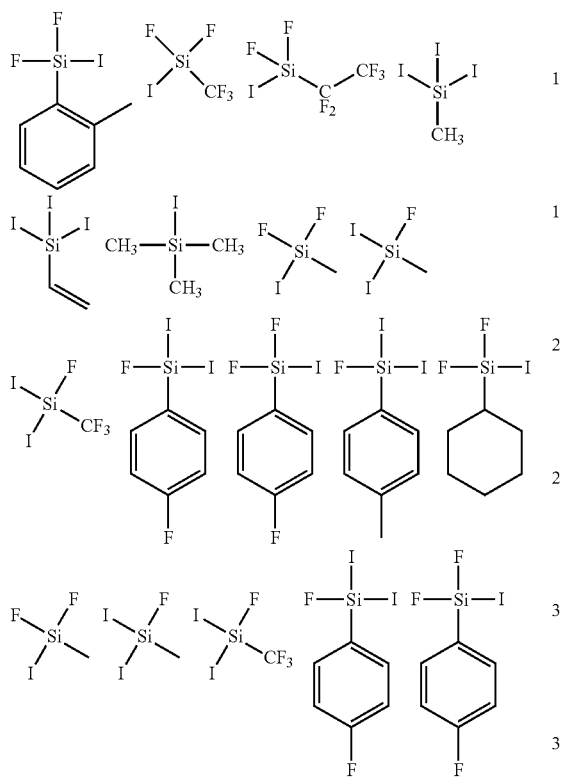

-continued

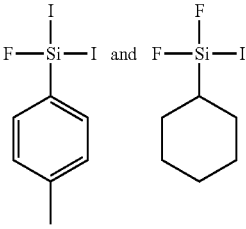

and

The disclosed additives $SiI_zF_{(4-z)}$ above may include

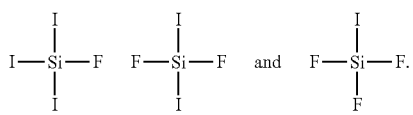

The disclosed additives $C_nF_{(2n+1)}I$ include

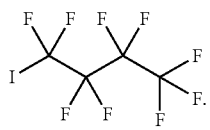 [SMILES: FC(F)(F)C(F)(F)C(F)(F)C(F)(F)I]

Exemplary disclosed additives containing Si, C, and/or iodine elements are listed in Table 1. These molecules are commercially available or may be synthesized by methods known in the art. Their structure formula, CAS numbers and boiling points are included in the Table. The disclosed additives containing with Si, C, and/or iodine elements may also include their isomers.

TABLE 1

| Name | Formula | Structure | CAS No. | Boiling Point |
|---|---|---|---|---|
| Iodo-methane | $CH_3I$ |  | 74-88-4 | 42.5° C. |
| Iodo-benzene | $C_6H_5I$ | 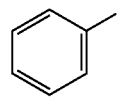 | 591-50-4 | 188.4° C. |
| 2-iodopropane | $C_3H_7I$ |  | 75-30-9 | 90° C. |
| 1-Iodopropane | $C_3H_7I$ |  | 107-08-4 | 102.6° C. |
| 1-iodoethane | $C_2H_5I$ | 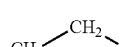 | 75-03-6 | 72° C. |
| Perfluorobutyl iodide | 1-$C_4F_9I$ | 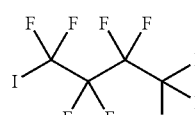 | 423-39-2 | 67.0° C. |
| Difluoroiodo-methane | $CHIF_2$ | | 1493-03-4 | 21.6° C. |

TABLE 1-continued

| Name | Formula | Structure | CAS No. | Boiling Point |
|---|---|---|---|---|
| Difluoroiodo(pentafluoroethyl)-silane | $C_2F_7ISi$ | | 36972-59-5 | 52.1 ± 35.0° C. at pressure 760 Torr |
| 1-(difluoroiodosilyl)-2-methylbenzene | $C_7H_7F_2ISi$ | | 174711-76-3 | 217.3 ± 33.0° C. |
| Difluoroiodo(trifluoromethyl)-silane | $CF_5ISi$ | | 27668-68-4 | 44.3 ± 30.0° C. |
| Triethyliodo-silane | $C_6H_{15}ISi$ | | 1112-49-8 | 190.5° C. |
| Fluorotriiodo-silane | $FI_3Si$ | | 16865-60-4 | 188° C. at pressure 752 Torr |
| Bifluorobiiodo-silane | $F_2I_2Si$ | | 27669-15-4 | 84.5° C. at pressure 756 Torr |
| Trifluoroiodo-silane | $F_3ISi$ | | 27668-68-4 | 44.3 ± 30.0° C. at pressure 760 Torr |
| Iodotrimethyl-silane | $C_3H_9ISi$ | | 16029-98-4 | 106-107° C. |
| Diiodosilane | $SiH_2I_2$ | | 13760-02-6 | 56-60° C. |

Since high volatility is preferred for etch gases, the high volatility is also required for additive chemicals. As described above, small alkyl groups are used as substituents on silicon for the additives, which provide the disclosed additives having high volatility. Another advantage offered by using the alkyl substituents is an increased likelihood of incorporating carbon into the passivation of the sidewall due to generation of poor carbon leaving groups. The use of aromatic substituents on silicon is also proposed in novel molecules as inclusion of aromatic groups into the passivation of the sidewall may lead to increased conductivity. The substitution on the aromatic groups is also of interest as the electronics of the aromatic ring may alter the conductivity. However, one skilled in the art will understand that low volatility etch materials may also be used. The low volatility etch materials mat be used through various methods such as heating the source of the low volatility etch material to increase the volatility including heating a container or cylinder that contains the low volatility etch material and gas lines that connect to the etching tool, using a bubbler method where an inert gas bubbles through a liquid low volatility etch material, or the like.

The disclosed additives are suitable to engineer the passivation layer property formed on the sidewalls of the high aspect ratio holes/trenches. The sidewall passivation and downward etch occur simultaneously. The passivation layer may from the carbon source in plasma etching gas, from the reactions between etching gases and the materials being exposed, or from the redeposition of byproduct from the etch process. The additives to the etchant strongly affect the chemical composition of the sidewall passivation by introducing conductive elements and/or chemical bonds, thereby positively affect the conductivity of the sidewall passivation. Over the course of plasma etching, the potential the bottom of the structure charges positively while the sidewalls charge negatively, thereby building undesired local electrical fields within the structure. Only energetic ions with energy larger than the potential difference along the local electrical field can reach to bottom. Charges on the sidewall dissipates fast as the conductivity of sidewall passivation increases. The required bias power is below a baseline process.

The disclosed etching gases may be fluorocarbons/hydrofluorocarbons. Exemplary disclosed fluorocarbons/hydrofluorocarbons include $CF_4$, $CH_3F$, $C_2F_6$, $C_3F_6$, $C_2HF_5$, $C_5F_8$, $C_6F_6$, $C_4F_6$, $C_4F_8$, $C_1$ to $C_5$ saturated or unsaturated linear, branched, cyclic hydrofluorocarbons, such as $C_4H_2F_6$, $CHF_3$, $CH_2F_2$, or combinations thereof.

The disclosed fluorocarbons/hydrofluorocarbons are suitable for etching silicon-containing films that include a layer of silicon oxide (SiO), silicon nitride (SiN), pure silicon (Si) such as crystalline Si, poly-silicon (p-Si or polycrystalline Si); amorphous silicon, low-k SiCOH, SiOCN, SiC, SiON, $Si_aO_bH_cC_dN_e$, where a>0; b, c, d and e≥0; metal containing films (e.g., copper, cobalt, ruthenium, tungsten, indium, platinum, palladium, nickel, ruthenium, gold, etc.), or the like. The silicon-containing film may also include alternating SiO and SiN (ONON) layers or SiO and p-Si (OPOP) layers. The silicon-containing films contain O and/or N. The silicon-containing films may also include dopants, such as B, C, P, As Ga, In, Sn, Sb, Bi and/or Ge, and combinations thereof.

The disclosed fluorocarbons/hydrofluorocarbons and additives are provided at greater than 95% v/v purity, preferably at greater than 99.99% v/v purity, and more preferably at greater than 99.999% v/v purity. The disclosed fluorocarbons/hydrofluorocarbons and additives contain less than 5% by volume trace gas impurities, with less than 150 ppm by volume of impurity gases, such as $N_2$ and/or $H_2O$ and/or $CO_2$, contained in said trace gaseous impurities. Preferably, the water content in the plasma etching gas is less than 20 ppm by weight. The purified product may be produced by distillation and/or passing the gas or liquid through a suitable adsorbent, such as a 4 Å molecular sieve.

The disclosed fluorocarbons/hydrofluorocarbons and additives contain less than 10% v/v, preferably less than 1% v/v, more preferably less than 0.1% v/v, and even more preferably less than 0.01% v/v of any of its isomers, which may be purified by distillation of the gas or liquid to remove isomers and may provide better process repeatability.

The disclosed fluorocarbons/hydrofluorocarbons selectively etch the silicon-containing layers from a buried landing layer or material which is a metal layer located at the bottom of the structure to be etched in most applications. The disclosed fluorocarbons/hydrofluorocarbons do not etch metal landing layers. The buried landing layer may be an etching stop layer or a diffusion barrier layer. Materials of the metal landing layers may be a tungsten metal wordline in a 3D NAND structure and/or another metal such as W, Cu, Al, Ru, Pt, Ti, Ta, Ni, Co, Mo, Mn, Pd, Ir, Nb, Cr, Rh, V, Au, Ag or combination thereof and/or etch stop layers such as metals or metal oxides or nitrides layer such as AlO, WO, HfO, TiO, TaO, InO, CrO, RuO, CoO, MoO, ZrO, SnO TiN, TaN, HfN, AlN, WN, MoN, NiN, NbN, CrN, RuN, CoN, ZrN, SnN or combination thereof etc.

The disclosed fluorocarbons/hydrofluorocarbons may be used to plasma etch silicon-containing films on a substrate. The disclosed plasma etching method may be useful in the manufacture of semiconductor devices such as NAND or 3D NAND gates or Flash or DRAM memory or transistors such as fin-shaped field-effect transistor (FinFET), Gate All Around(GAA)-FET, Nanowire-FET, Nanosheet-FET, Forksheet-FET, Complementary FET (CFET), Bulk complementary metal-oxide-semiconductor (Bulk CMOS), MOSFET, fully depleted silicon-on-insulator (FD-SOI) structures. The disclosed iodine-containing etching compounds may be used in other areas of applications, such as different front end of the line (FEOL) and back end of the line (BEOL) etch applications. Additionally, the disclosed iodine-containing etching compounds may also be used for etching Si in 3D through silicon via (TSV) etch applications for interconnecting memory to logic on a substrate and in MEMS applications.

The disclosed etching method includes providing a reaction chamber having a substrate disposed therein. The reaction chamber may be any enclosure or chamber within a device in which etching methods take place such as, and without limitation, reactive ion etching (RIE), CCP with single or multiple frequency RF sources, inductively coupled plasma (ICP), or microwave plasma reactors, or other types of etching systems capable of selectively removing a portion of the silicon-containing film or generating active species. One of ordinary skill in the art will recognize that the different plasma reaction chamber designs provide different electron temperature control. Suitable commercially available plasma reaction chambers include but are not limited to the Applied Materials magnetically enhanced reactive ion etcher sold under the trademark eMAX™ or the Lam Research Dual CCP reactive ion etcher dielectric etch product family sold under the trademark 2300® Flex™, or the Advanced Micro-Fabrication Equipment Inc. China (AMEC) Primo SSC HD-RIE etcher. The RF power in such may be pulsed to control plasma properties and thereby improving the etch performance (selectivity and damage) further.

The reaction chamber may contain one or more than one substrate. For example, the reaction chamber may contain from 1 to 200 silicon wafers having from 25.4 mm to 450 mm diameters. The substrates may be any suitable substrates used in semiconductor, photovoltaic, flat panel or LCD-TFT device manufacturing. Examples of suitable substrates include wafers, such as silicon, silica, glass, Ge, SiGe, GeSn, InGaAs, GaSb, InP, or GaAs wafers. The wafer will have multiple films or layers on it from previous manufacturing steps, including silicon-containing films or layers. The layers may or may not be patterned. Examples of suitable layers include without limitation silicon (such as amorphous silicon, p-Si, crystalline silicon, any of which may further be p-doped or n-doped with B, C, P, As, Ga, In, Sn, Sb, Bi and/or Ge), silica, silicon nitride, silicon oxide, silicon oxynitride, $Si_aO_bH_cC_dN_e$, (wherein a>0; b, c, d, e≥0), Ge, SiGe, GeSn, InGaAs, GaSb, InP; mask layer materials such as amorphous carbon with or without dopants, antireflective coatings, photoresist materials, a metal oxide, such as AlO, TiO, HfO, ZrO, SnO, TaO etc. or a metal nitride layer such as AlN, ZrN, SnN, HfN, titanium nitride, tantalum nitride etc. or combinations thereof; etch stop layer materials such as silicon nitride, polysilicon, crystalline silicon, silicon carbide, SiON, SiCN or combinations thereof, device channel materials such crystalline silicon, epitaxial silicon, doped silicon, $Si_aO_bH_cC_dN_e$, (wherein a>0; b, c, d, e≥0) or combinations thereof. a-C (amorphous carbon) is a carbon film deposited using a PE-CVD process. The composition is primarily carbon containing with some hydrogen content. Doped a-C is an amorphous carbon film where during the deposition process a dopant is additionally deposited. The dopant may include: Boron, Zirconium, Aluminum, Titanium, Tungsten. Carbon films may also be deposited using a spin on process as opposed to a PE-CVD process. The silicon oxide layer may form a dielectric material, such as an organic based or silicon oxide based low-k dielectric material (e.g., a porous SiCOH film). An exemplary low-k dielectric material is sold by Applied Materials under the trade name Black Diamond II or III. Additionally, layers comprising tungsten or noble metals (e.g. platinum, palladium, rhodium or gold) may be used. Furthermore, examples of the silicon-containing films may be $Si_aO_bH_cC_dN_e$, (wherein a>0; b, c, d, e≥0). Throughout the specification and claims, the wafer and any associated layers thereon are referred to as substrates.

The disclosed etching method includes pumping the reactor chamber down to a high vacuum after placing the substrate into the chamber and before introducing the disclosed fluorocarbons/hydrofluorocarbons into the chamber. The high vacuum may range from 0.01 mTorr-10 mTorr.

An inert gas is also introduced into the reaction chamber in order to sustain the plasma. The inert gas may be He, Ar, Xe, Kr, Ne, $N_2$, He or combinations thereof. The etching gas and the inert gas may be mixed prior to introduction to the chamber, with the inert gas comprising between approximately 0.01% v/v and approximately 99.9% v/v of the resulting mixture. Alternatively, the inert gas may be introduced to the chamber continuously while the etching gas is introduced to the chamber in pulses.

The vapor of the disclosed etching gas and inert gas are activated by plasma to produce an activated etching gas. The plasma decomposes the etching gas into radical form (i.e., the activated etching gas). The plasma may be generated by applying RF or DC power. The plasma may be generated with a RF power ranging from about 25 W to about 100,000 W. The plasma may be generated remotely or within the reactor itself. The plasma may be generated in dual CCP or ICP mode with RF applied at both electrodes. RF frequency of plasma may range from 100 KHz to 1 GHz. Different RF sources at different frequency may be coupled and applied at same electrode. Plasma RF pulsing may be further used to control molecule fragmentation and reaction at substrate. One of skill in the art will recognize methods and apparatus suitable for such plasma treatment.

A quadrupole mass spectrometer (QMS), optical emission spectrometer, FTIR, or other radical/ion measurement tools may measure the activated etching gas from the chamber exhaust to determine the types and numbers of species produced. If necessary, the flow rate of the etching gas and/or the inert gas may be adjusted to increase or decrease the number of radical species produced.

The disclosed etching gases and additives may be mixed with other gases or co-reactants either prior to introduction into the reaction chamber or inside the reaction chamber. Preferably, the gases may be mixed prior to introduction to the chamber in order to provide a uniform concentration of the entering gas.

In another alternative, the vapor of the hydrofluorocarbon etching compound and the additive may be introduced into the chamber independently of the other gases, such as when two or more of the gases react or are easier to deliver independently.

In another alternative, the hydrofluorocarbon etching gas and the additive gas are the only two gases that are used during the etching process.

In another alternative, the hydrofluorocarbon etching gas, the additive gas and the inert gas are the only three gases that are used during the etching process.

Exemplary other gases or co-reactant include, without limitation, oxidizers such as $O_2$, $O_3$, CO, $CO_2$, NO, $N_2O$, $NO_2$, $H_2O$, $H_2O_2$, COS, $SO_2$ and combinations thereof. The disclosed etching gases/additives and the oxidizer may be mixed together prior to introduction into the reaction chamber.

Alternatively, the oxidizer may be introduced continuously into the chamber and the etching gas introduced into the chamber in pulses. The oxidizer may comprise between approximately 0.01% v/v to approximately 99.99% v/v of the mixture introduced into the chamber (with 99.99% v/v representing introduction of almost pure oxidizer for the continuous introduction alternative).

Other exemplary gases with which the disclosed hydrofluorocarbon etching gas and additive gas may be used include additional etching gases, such as $cC_4F_8$, $C_4F_8$, $cC_5F_8$, $C_5F_8$, $C_4F_6$, $CF_4$, $CH_3F$, $CF_3H$, $CH_2F_2$, $C_3HF_7$, $C_3F_6$, $C_3H_2F_6$, $C_3H_2F_4$, $C_3H_3F_5$, $C_4HF_7$, $C_5HF_9$, $C_3F_6$, $C_3F_8$, $CF_3I$, $C_2F_3I$, $C_2F_5I$, $C_3F_7I$, 1-Iodoheptafluoropropane (1-$C_3F_7I$), 2-Iodoheptafluoropropane (2-$C_3F_7I$), $C_3HF_7$, COS, FNO, F—C≡N, $CS_2$, $SO_2$, $H_2S$, $SF_6$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), and cis-1,1,2,2,3,4-hexafluorocyclobutane (cis-$C_4H_2F_6$) or combination thereof. For example, approximately 1% v/v to approximately 25% v/v of the disclosed iodine-containing etching compound may be used with a balance of $C_4F_8$ or $cC_4F_8$. As shown in the examples that follow, the combination of the disclosed iodine-containing etching compounds with conventional etch gases may result in increased etch rates while maintaining the higher selectivity between the substrate and layer to be etched associated with the disclosed iodine-containing etching compounds.

The vapors of the disclosed etching compounds and/or the additive are introduced into the reaction chamber containing the substrate and silicon-containing films. The vapors may be introduced to the chamber at a flow rate ranging from approximately 0.1 sccm to approximately 1 sim, respectively. For example, for a 200 mm wafer size, the vapor may be introduced to the chamber at a flow rate ranging from approximately 5 sccm to approximately 50 sccm. Alternatively, for a 450 mm wafer size, the vapor may be introduced to the chamber at a flow rate ranging from approximately 25 sccm to approximately 250 sccm. One of ordinary skill in the art will recognize that the flow rate may vary from tool to tool. The vapors of the disclosed etching compounds and/or the additive may be introduced into the reaction chamber premixed or separately.

The disclosed etching compounds and additives may be supplied either in neat form or in a blend with a suitable solvent, such as ethyl benzene, xylenes, mesitylene, decane, or dodecane. The disclosed compounds and additives may be present in varying concentrations in the solvent. The vapor form of the disclosed compounds and additives may be produced by vaporizing the neat or blended disclosed compounds and additives solution through a conventional vaporization step such as direct vaporization or by bubbling. The neat or blended disclosed compounds and additives may be fed in liquid state to a vaporizer where it is vaporized before it is introduced into the reactor. Alternatively, the neat or blended disclosed compounds and additives may be vaporized by passing a carrier gas into a container containing the disclosed compounds and additives or by bubbling the carrier gas into the disclosed compounds and additives. The carrier gas may include, but is not limited to, Ar, He, $N_2$, Xe, Kr, Ne, and mixtures thereof. The carrier gas and disclosed compounds and additives are then introduced into the reactor as a vapor.

If necessary, the container containing the disclosed compounds and additives may be heated to a temperature that permits the disclosed compounds and additives to be in liquid phase and to have a sufficient vapor pressure. The container may be maintained at temperatures in the range of, for example, approximately 0° C. to approximately 150° C. The lines from the bubbler to the etching tool may also be maintained at a temperature at or above the temperature of the container. Those skilled in the art recognize that the temperature of the container may be adjusted in a known manner to control the amount of disclosed compounds and additives vaporized.

The vapor of the disclosed hydrofluorocarbon etching gas and additive gas and the additional etching gas may be mixed prior to introduction to the reaction chamber. The additional etching gas may comprise between approximately 0.01% v/v to approximately 99.99% v/v of the mixture introduced into the chamber.

The vapor of the disclosed etching gas and additional gases such as inert gas and co-reactant are activated by plasma to produce an activated etching gas. The plasma decomposes the etching gas into radical form or ion (i.e., the activated etching gas). The plasma may be generated by applying RF or DC power. The plasma may be generated with a RF source power ranging from about 25 W to about 100,000 W in a decoupled plasma etching reactor. The plasma may be generated remotely or within the reactor itself. The plasma may be generated, but not limited to, in dual CCP or ICP mode with RF applied at both electrodes. RF frequency of plasma may range from 100 KHz to 1 GHz. Different RF sources at different frequency may be coupled and applied at same electrode. Plasma RF pulsing may be further used to control molecule fragmentation and reaction at substrate as a bias power. One of skill in the art will recognize methods and apparatus suitable for such plasma treatment.

Since the disclosed additives are used with the hydrofluorocarbons or fluorocarbons, the bias power may be low comparing to the etching without additives. In the disclosed methods, by applying the additives, the bias power may be lower at least approximately 10% than the case without using the additives, from the examples that follow.

The disclosed method of forming a high conductive sidewall passivation layer on a high aspect ratio patterned structure comprises i) introducing a vapor of an etchant into the reactor that contains a substrate; ii) creating an ion plasma from the etchant in the reactor by applying a source power; iii) causing the ions to diffuse towards the substrate by applying a reduced bias power such that the portions of the substrate not being covered by a pattered mask layer on the substrate are selectively etched away, forming the high aspect ratio patterned structure; and iv) keeping the process running for a predetermined time and turning the source power and the low bias power off until the high conductive sidewall passivation layer is formed on the sidewall of the high aspect ratio patterned structure.

Here, the substrate has a film disposed thereon and a patterned mask layer disposed on the film. The etchant includes a hydrofluorocarbon or fluorocarbon compound and an additive compound. The etchant may also include a co-reactant and/or an inert gas. After introducing the etchant into the reactor, the etchant is allowed to reach to an equilibrium. The reduced bias power may be at least 10% lower than that of without adding an additive in the etchant. The predetermined time ranges from 1 s to 1000 s. A ratio of the hydrofluorocarbon or fluorocarbon compound and the additive compound is chosen such that newly formed portions of sidewall surfaces become passivated and protected from further being etched. The ratio of the hydrofluorocarbon or fluorocarbon compound and the additive compound introduced into the reactor may vary from 1:99 to 99:1 by flow rates.

Before introducing the etchant into the reactor, the reactor is pumped down to a high vacuum ranging from 0.001 mTorr to 100 mTorr after the etch process the reactor may be purged by inert gas.

The temperature of the reactor chamber may be controlled by either controlling the temperature of the substrate holder or controlling the temperature of the reactor wall. Devices used to heat the substrate are known in the art. The reactor wall is heated to a sufficient temperature to prevent condensation on the wall or the reactor chamber, especially when a shower head reactor is used, in which the substrate temperature is higher than the temperature of the wall. A non-limiting exemplary temperature range to which the reactor wall may be heated includes a range from approximately −100° C. (LN temp) to approximately 500° C., preferably from approximately 20° C. to approximately 150° C., more preferably from 20° C. to approximately 110° C.

The pressure within the reaction chamber are held at conditions suitable for an etchant or a process gas the portions of the substrate not being covered by the patterned mask layer. Here the etchant or the process gas may include a hydrofluorocarbon or fluorocarbon etching gas, an additive, co-reactants, etc. For instance, the pressure in the reactor may be held between approximately 1 mTorr and approximately 100 Torr, preferably between approximately 1 mTorr and approximately 50 Torr, more preferably between approximately 1 mTorr and approximately 10 Torr, even more preferably between approximately 1 mTorr and approximately 50 mTorr.

Etching conditions may change during the etching process. For example parameters such as gas flow, plasma power, pressure, temperature may be higher or lower during the beginning part of the etch as compared to the end part of the etch near the bottom of the hole or trenches. Alternatively, different etching gases may be added at different points in the etch to improve the performance such as to reduce or enhance the polymer deposition rate.

The disclosed etching methods provide high selectivity to mask layers, photoresist, etch stop layers and device channel materials and no profile distortion in HAR structures, such as those having an aspect ratio ranging from 1:1 to 200:1 such as DRAM and 3D NAND structures and contact etch applications. Alternatively, an aspect ratio ranging from 1:1 to 20:1 and an aspect ratio ranging from 21:1 to 200:1. The disclosed etching methods are suitable for etching HAR patterned structure having an aspect ratio between approximately 1:1 and approximately 200:1. Alternatively, the disclosed etching methods are suitable for etching HAR patterned structure having an aspect ratio between approximately 1:1 and approximately 20:1, an aspect ratio between approximately 21:1 and approximately 200:1, an aspect ratio between approximately 1:1 and approximately 60:1, or an aspect ratio between approximately 61:1 and approximately 200:1.

EXAMPLES

The following non-limiting examples are provided to further illustrate embodiments of the invention. However, the examples are not intended to be all inclusive and are not intended to limit the scope of the inventions described herein.

In the following examples, experiments were carried out with commercial LAM tool 4520XLe 200 mm (CCP dual frequency plasma) or alternatively with commercial AMEC 300 mm Primo SSC HD-RIE etcher. To prove the repeatability, each etching test have been repeated at least three times. Standard deviation of the average of the three measurements is shown as error bar in the chart. Subsequently, polymer composition was studied by X-Ray Photoelectron Spectroscopy (XPS).

Example 1: Polymer Electrical Conductivity Measurements

Figure 2:
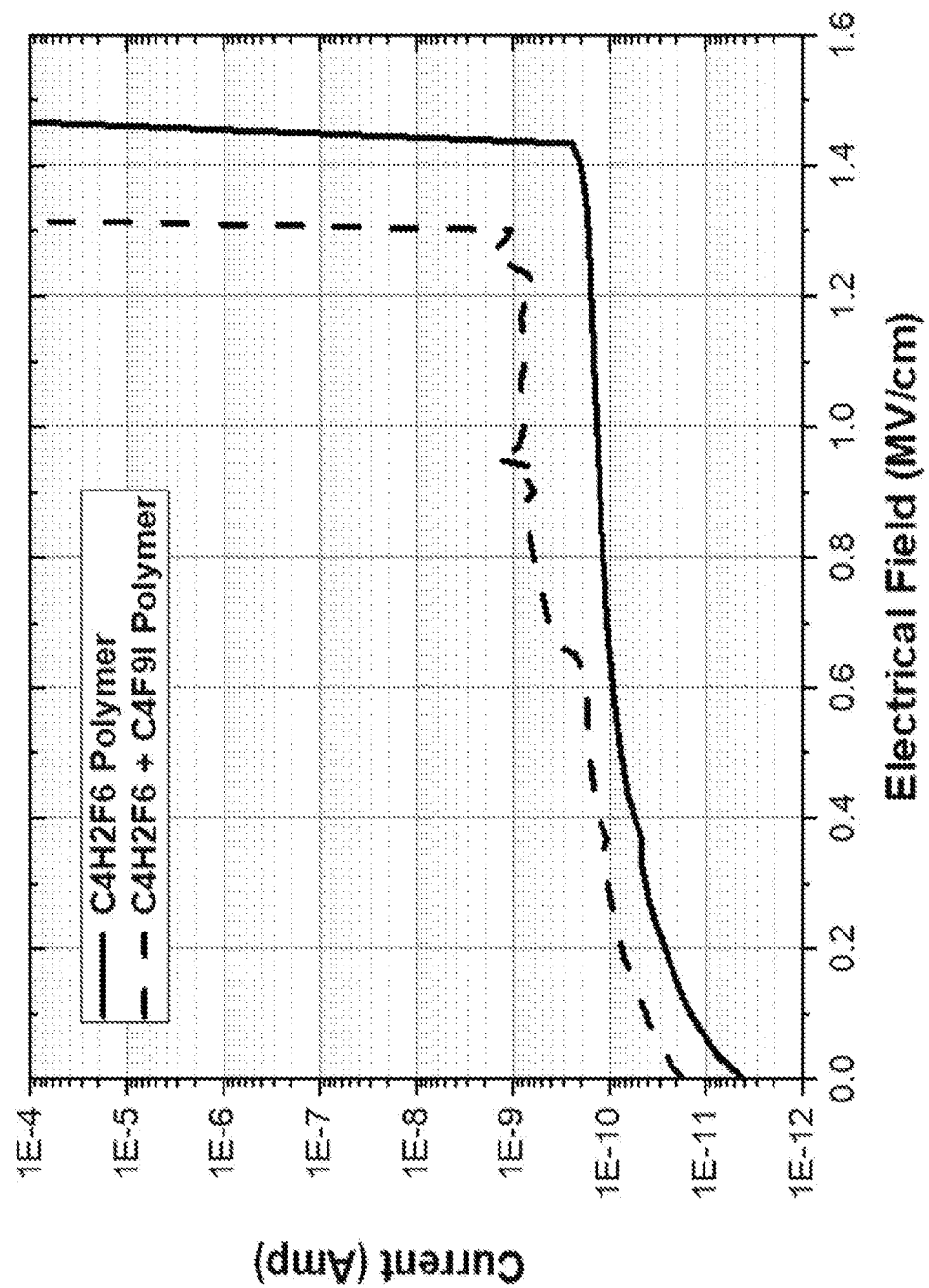
FIG. 2 is conductivity of $C_4H_2F_6$ with and without an additive $C_4F_9I$ measured on a planar wafer.
Figure 3:
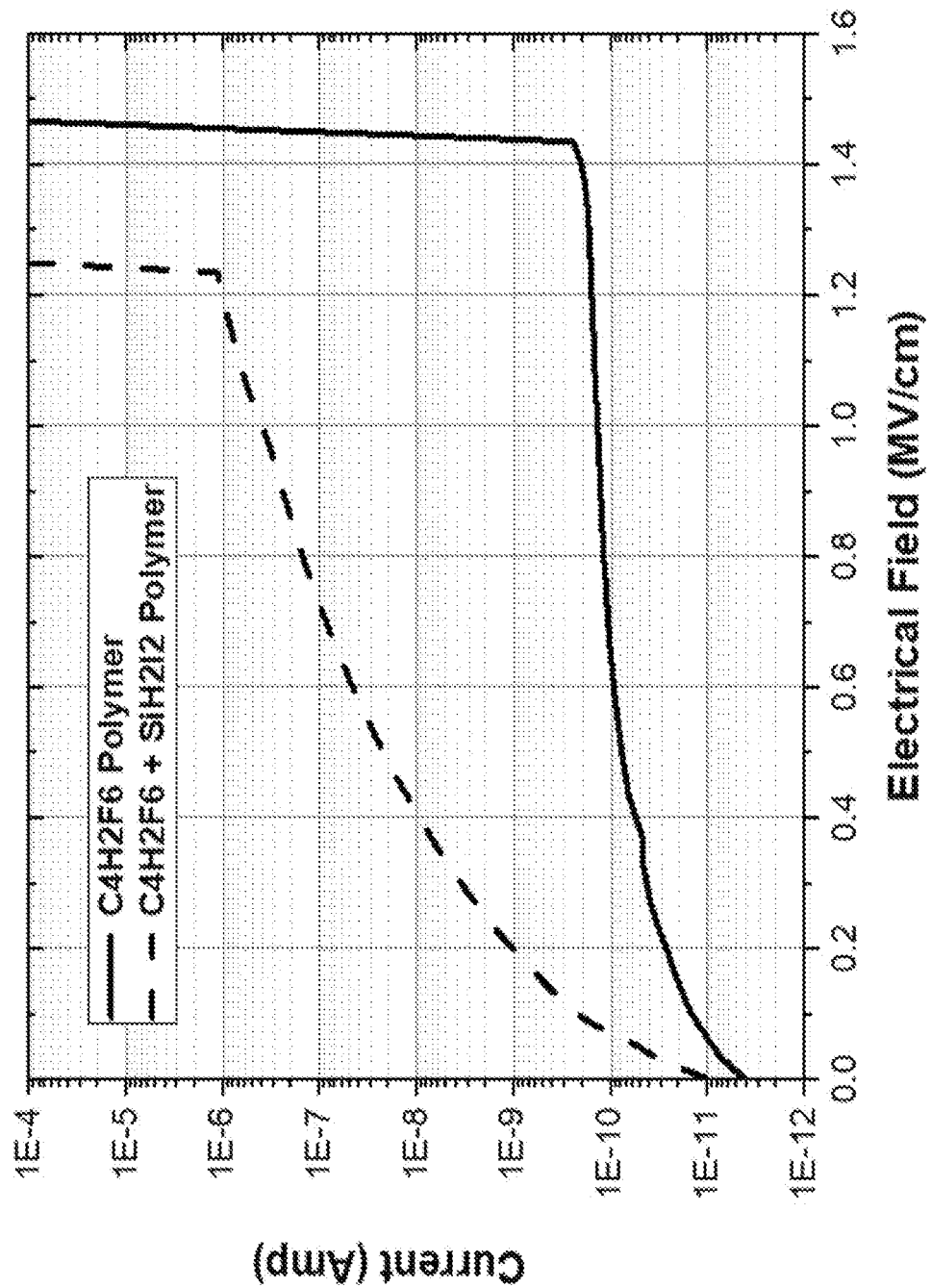
FIG. 3 is conductivity of $C_4H_2F_6$ with and without an additive $SiH_2I_2$ measured on a planar wafer.
Figure 4:
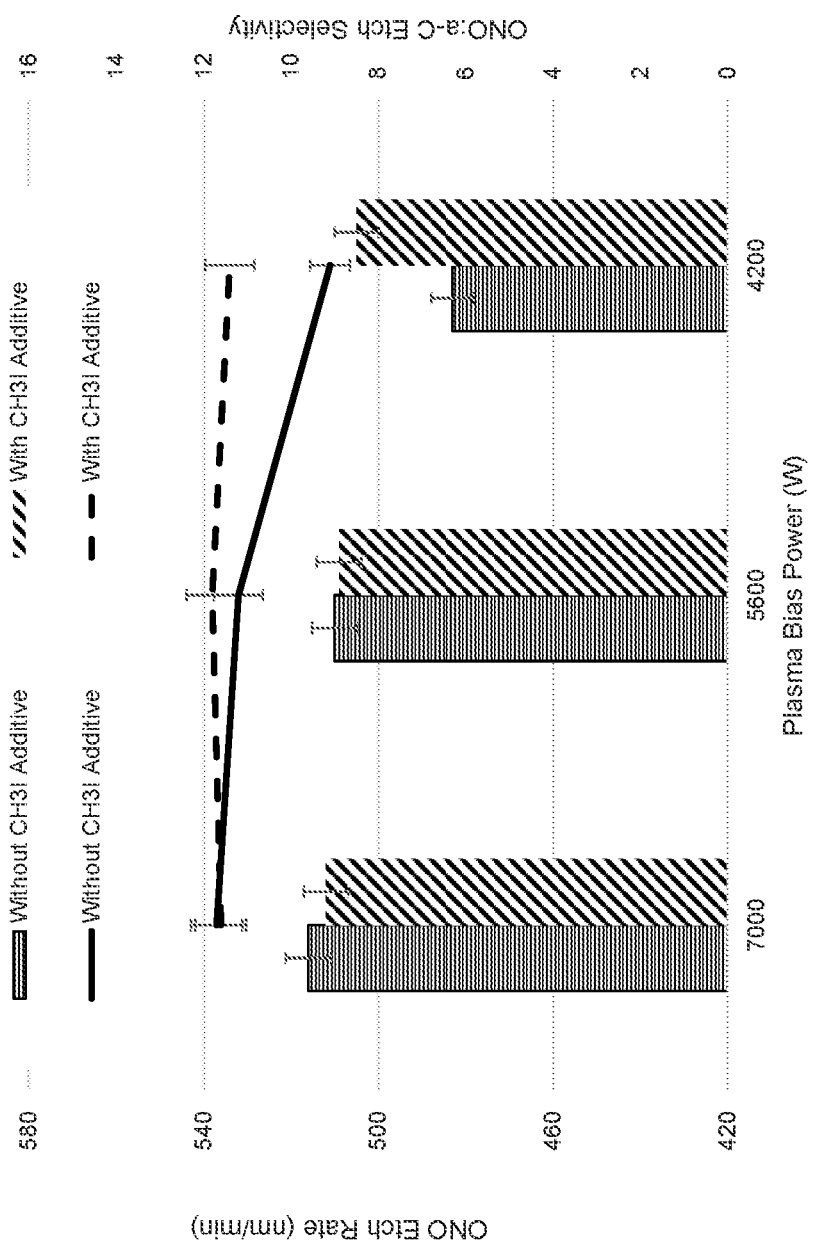
FIG. 4 is a comparison of ER and selectivity of $C_4H_2F_6$ with and without $CH_3I$ additive, respectively.
Figure 5:
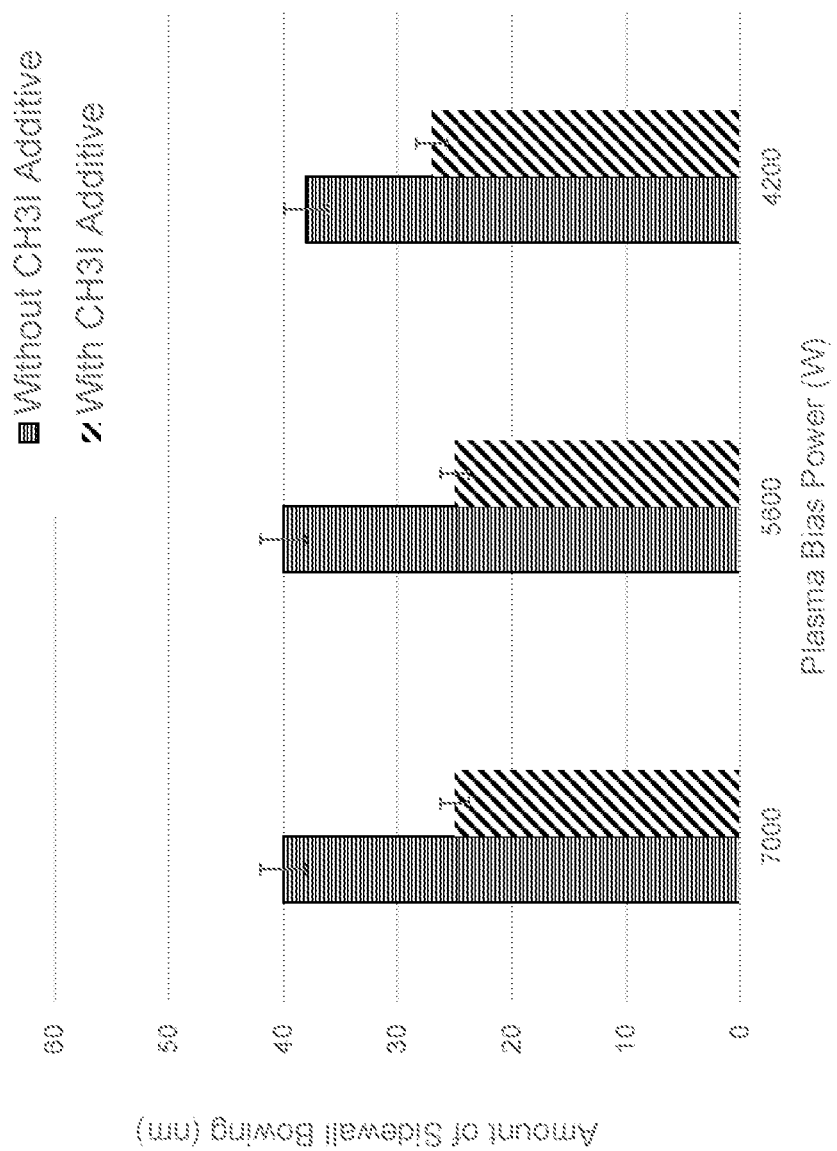
FIG. 5 is a comparison of sidewall bowing of $C_4H_2F_6$ with and without $CH_3I$ additive.

FIG. 1 to FIG. 3 are conductivities of $C_4H_2F_6$ with and without an additive $CH_3I$, $C_4F_9I$ or $SiH_2I_2$ measured on a planar wafer, respectively. The current (I)-Voltage (V) was measured using mercury probe. A drop of deionized water was added to the back of the wafer to improve contact resistance, which may help lower the measurement noise at lower voltage. Under the same electrical field strength, iodine-molecule additive into the hydrofluorocarbon induces higher measured current and lower breakdown voltage through the polymer. The conductivity of $C_4H_2F_6$ with the additive is increased comparing to that of $C_4H_2F_6$ without the additive. See current differences in FIG. 1 to FIG. 3. As shown in Table 1, the conductivity was calculated at the electrical field of 0.2 MV/cm, and the increase in conductivity at the electrical field of 0.2 MV/cm was >10%.

TABLE 1

|  | Conductivity (S/cm) |
| --- | --- |
| $C_4H_2F_6$ | $2.97 \times 10^{-9}$ |
| $C_4H_2F_6 + CH_3I$ | $3.52 \times 10^{-9}$ |
| $C_4H_2F_6 + C_4F_9I$ | $8.35 \times 10^{-9}$ |
| $C_4H_2F_6 + SiH_2I_2$ | $1.14 \times 10^{-7}$ |

Example 2: ONON Hole Pattern Etch Using $CH_3I$ as an Additive $CH_3I$ was added into an etching recipe including $C_4H_2F_6$ for ONON (i.e., SiO/SiN alternating layers) hole pattern etch on a patterned wafer or a substrate, due to the promising performance (higher selectivity to a-C mask and increased polymer conductivity) on planar thin films. The patterned wafer has ONON layers where a hole patterned amorphous-carbon (a-C) mask layer is deposited thereon. The etching recipe may also include $O_2$.

Four conditions were tested for the preliminary screening: $C_4H_2F_6/CH_3I$ flow rates at 30/10 sccm, 35/5 sccm, 40/5 sccm and 40/10 sccm, in which 30/10 sccm and 35/5 sccm have the same total gas flow. Since $CH_3I$ is very polymerizing, etch stop were observed for case of $CH_3I$ flow rate being 10 sccm or beyond through SEM images. Condition of 40/5 sccm shows improved etch selectivity, while further etching recipe tuning is needed. SEM Conditions are as flows. Accel. Voltage: 5.0 kV; Emission Current: 20 µA; Magnitude: ×30.0 k.

$CH_3I$ is very polymerizing, which may clog the patterned mask layer and further leads etch stop with a flow rate of 10 sccm or beyond added into the ONON etching composition. With $CH_3I$ added into the etching recipe, process window of $O_2$ flow rate shifts from 68 sccm to 74-76 sccm. For optimized $CH_3I$ recipe: ONON etch rate (ER): 510 nm/min (without $CH_3I$, measured ONON ER is 516 nm/min); ONON/a-C Selectivity: 11.2-12 (without $CH_3I$, ONON/a-C Selectivity is 11.4-12). FIG. 4 to FIG. 9 are comparisons of ER, selectivity, sidewall bowing, ellipticity, critical dimension (CD) with different bias powers of $C_4H_2F_6$ with and without $CH_3I$ additive, respectively. Overall, the recipe with $CH_3I$ show less dependence on the bias power (ONON etch rate, selectivity, bowing, ellipticity, profile CD), compared to the recipe without $CH_3I$.

Figure 6:
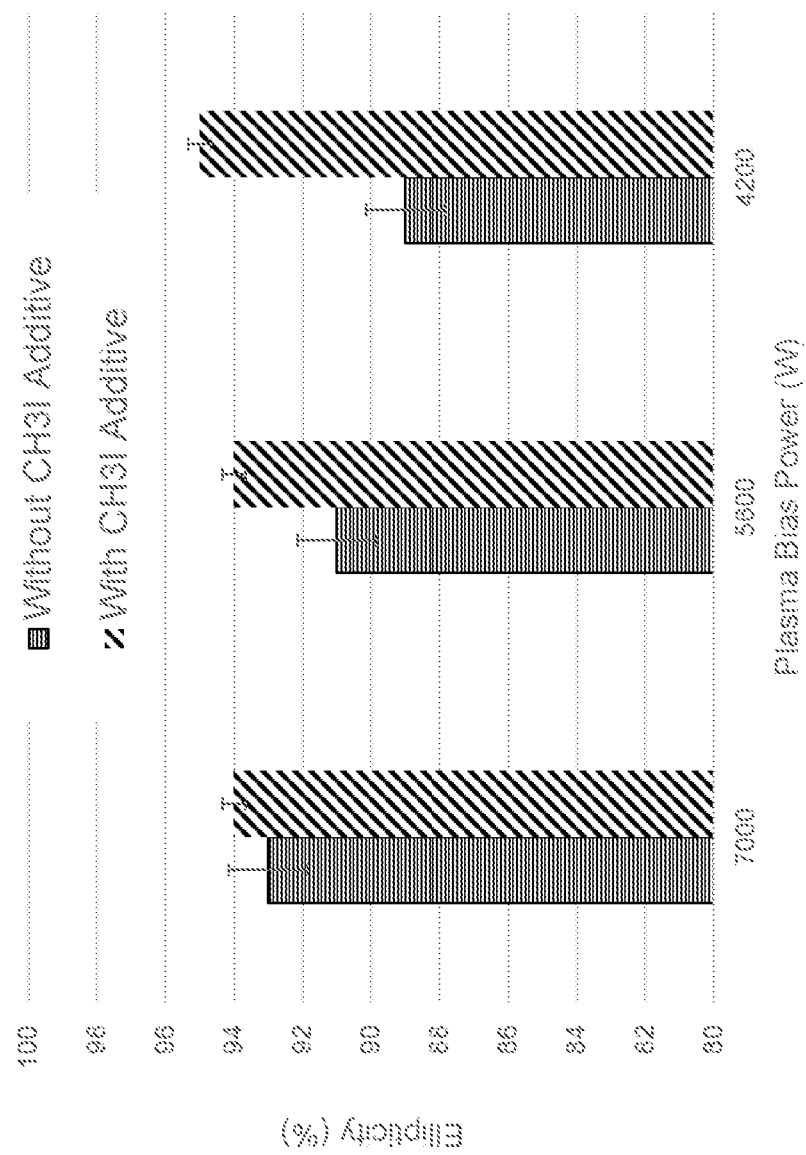
FIG. 6 is a comparison of ellipticity of $C_4H_2F_6$ with and without $CH_3I$ additive.
Figure 7:
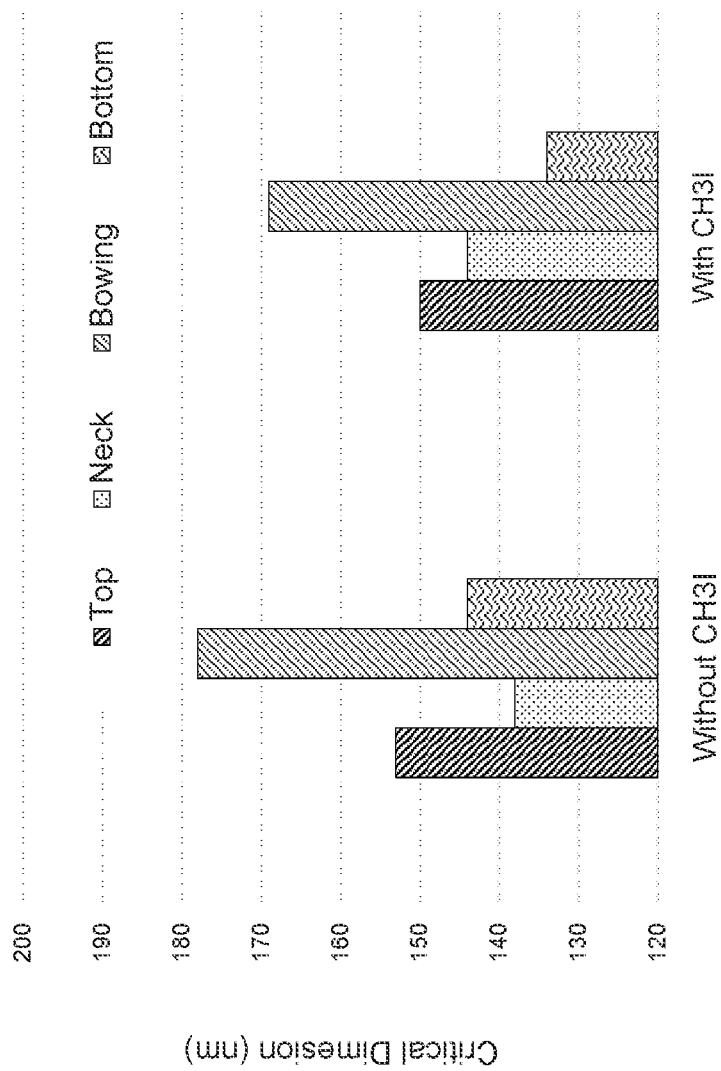
FIG. 7 is a comparison of critical dimension (CD) of $C_4H_2F_6$ with and without $CH_3I$ additive with a bias power of 7000 W.
Figure 8:
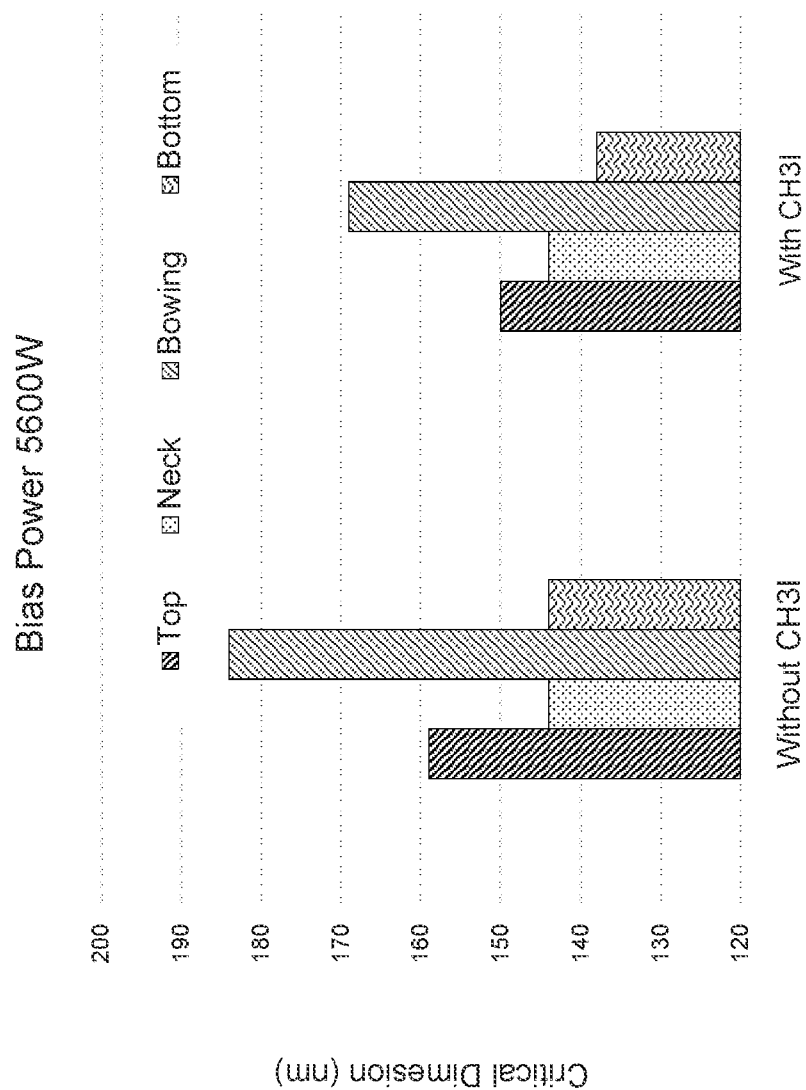
FIG. 8 is a comparison of CD of $C_4H_2F_6$ with and without $CH_3I$ additive with a bias power of 5600 W.
Figure 9:
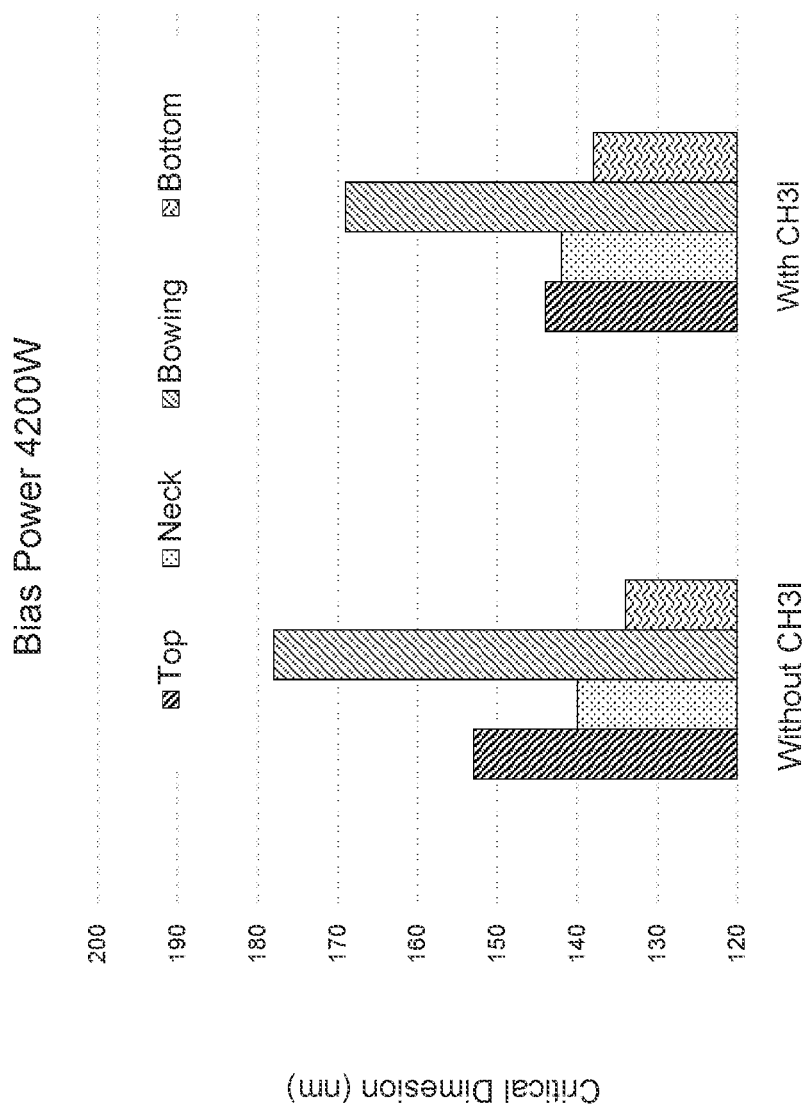
FIG. 9 is a comparison of CD of $C_4H_2F_6$ with and without $CH_3I$ additive with a bias power of 4200 W.

More specifically, as shown in FIG. 6, at bias power of 7000 W, adding $CH_3I$ into the recipe does not show significant ellipticity change of a-C mask holes, with measured ellipticity of 93% for the recipe without $CH_3I$ and 94% for the recipe with $CH_3I$. At bias power of 5600 W, for recipe without $CH_3I$, the a-C mask profile degrades with reduced bias power, while less effect was observed for recipe with $CH_3I$. At bias power of 4200 W, the recipe with $CH_3I$ shows improved etch performance, including ER, selectivity, a-C mask ellipticity and slant angle. Table 2 summarized the etch performance.

TABLE 2

| Etch Performance Summary ||||||
| --- | --- | --- | --- | --- | --- |
| Etch | @ 7000 W Bias Power || @ 5600 W Bias Power (Reducing by 20%) || @ 4200 W Bias Power (Reducing by 40%) ||
| Performance | No $CH_3I$ | With $CH_3I$ | No $CH_3I$ | With $CH_3I$ | No $CH_3I$ | With $CH_3I$ |
| ER (ONON Layer) | 516 | 510 | 510 | 501 | 483 | 505 |
| Selectivity (ONON/a-C) | 11.4~12 | 11.2~12 | ~12.2 | ~12.8 | ~9.1 | ~11.4 |
| Profile Bowing (Bowing CD-Necking CD) | 40 | 39 | 40 | 25 | 38 | 31 |
| Ellipticity (a-C mask) | 93% | 94% | 91% | 94% | 89% | 95% |

In summary, with the additive $CH_3I$, the surface passivation (aka polymer layer) on etch front and sidewall of HAR features is improved and the passivation changes with varied plasma etching condition (RF power, process time, etc.). In addition, $CH_3I$ as an additive added into the hydrofluorocarbon etching gases reduces the bias power by 40%, without compromising the etch performance, such as etch rate, selectivity, ellipticity, profile CD and so on.

Example 3: Polymer Chemical Composition and Polymer Electrical Conductivity

Substrate: In order to obtain the I-V characteristic of the polymer only, low resistivity Si substrate (less than 0.02 Ohm·cm) was used for polymer deposition, instead of $SiO_2$ substrate. The Si substrate was cut into 1 inch×1 inch coupons to facilitate the I-V measurement using Mercury Probe.

Polymer deposition: the same deposition process condition was used for $C_4F_8$, $C_4H_2F_6$, $C_4F_9I$, $C_4F_8+C_4F_9I$ and $C_4H_2F_6+C_4F_9I$; the thickness of the deposited polymer was measured by ellipsometer; for the polymer on ion blocked area, the thickness was measured on the position 1 mm away from the shield coupon edge.

Lam Tool Experimental conditions: RF source power: 750 W; Bias power: 1500 W; Ar/Etch Gas (or Gas Mixture)/$O_2$: 250/15/0; etch time: 30 seconds.

Figure 10:
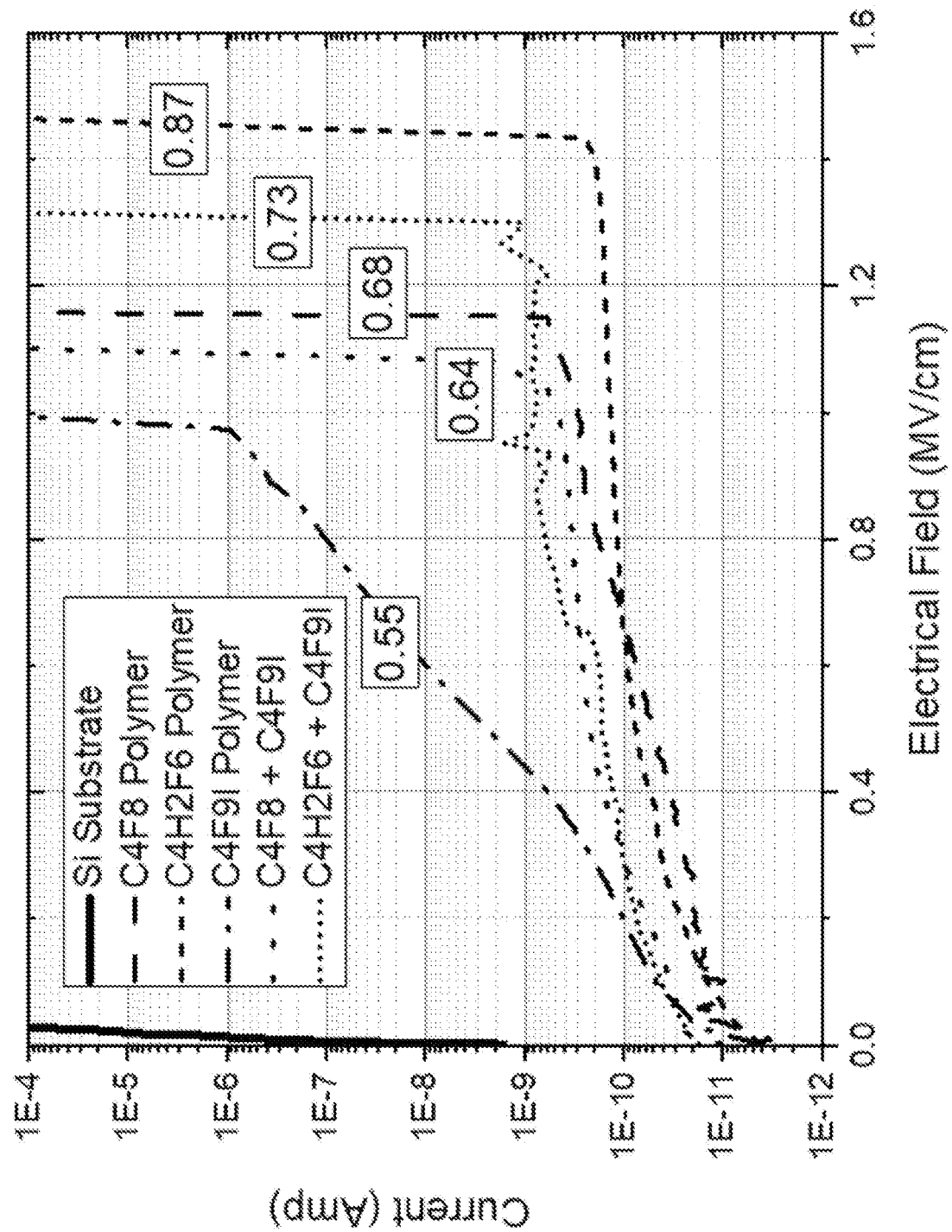
FIG. 10 is various polymer chemical compositions and polymer electrical conductivities.

FIG. 10 is various polymer chemical compositions and polymer electrical conductivities. The current (I)-Voltage (V) measurements were the same as those in Example 1. As shown, under the same electrical field strength, iodine-molecule additive into the hydrofluorocarbon induce higher measured current and lower breakdown voltage through the polymer, and the conductivities of various polymers and iodine-molecule additives at 0.2 MV/cm are as follows: $C_4F_9I>C_4H_2F_6+C_4F_9I>C_4F_8+C_4F_9I>C_4H_2F_6>C_4F_8$. The polymer with a higher C—C:C-Fx/C—I ratio has higher breakdown voltage and is more electrically strong. C—$F_x$ bond may contribute to the polymer conductivity. C—C bond rich polymer is less conducting than C—F, bod rich polymer.

Table 3 shows C—C:C—$F_x$/C—I (x is integer) bond concentration ratio. The C—C:C—$F_x$/C—I bond concentration ratio from low to high is $C_4F_8<C_4F_8+C_4F_8I<C_4Fe<C_4H_2F_6+C_4F_9I<C_4H_2F_6$. C—C bond is nonpolar covalent; C-Fx/C—I bond is polar covalent. The conductivity was calculated at the electrical field of 0.2 MV/cm, and the increase in conductivity at the electrical field of 0.2 MV/cm was >10%.

TABLE 3

|  | C—C | C—Fx/C—I | CC:C—Fx/C—I Ratio | Conductivity (S/cm)* |
|---|---|---|---|---|
| $C_4F_8$ | 38.2% | 56.35% | 0.68 | 2.14 × 10$^{-9}$ |
| $C_4H_2F_5$ | 41.97% | 48.32% | 0.87 | 2.97 × 10$^{-9}$ |
| $C_4F_9I$ | 30.93% | 56.23% | 0.55 | 1.32 × 10$^{-8}$ |
| $C_4F_8 + C_4F_9I$ | 35.92% | 55.69% | 0.64 | 6.65 × 10$^{-9}$ |
| $C_4H_2F_6 + C_4F_9I$ | 34.48% | 47.21% | 0.73 | 8.35 × 10$^{-9}$ |

Although it is challenge to tell how polymer chemical composition and electrical conductivity relate to each other, due to different conduction mechanisms at varied electrical field, in general, iodine additive to the polymer makes it more conductive, which in turn reduces the bias power by at least approximately 10% comparing to the case without using the additives, or even no bias power is required, without compromising the etch performance, such as etch rate, selectivity, ellipticity, profile CD and so on, as shown in Example 2.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for forming a patterned structure during an etch process in a substrate in a reaction chamber, the method comprising:
   sequentially or simultaneously exposing the substrate to a vapor of an etchant including $C_4H_2F_6$, an additional etch gas and an additive compound $CH_3I$, the substrate having a film disposed thereon and a patterned mask layer disposed on the film;
   activating a plasma to produce an activated $C_4H_2F_6$, an activated additional etch gas and an activated additive compound; and allowing an etching reaction to proceed between the film uncovered by the patterned mask layer and the activated $C_4H_2F_6$, the activated additional etch gas and the activated additive compound to selectively etch the film from the patterned mask layer, thereby forming the patterned structure,
   wherein the additional etch gas is selected from the group consisting of c$C_4F_8$, $C_4F_8$, c$C_5F_8$, $C_5F_8$, $C_4F_6$, $CF_4$, $CH_3F$, $CF_3H$, $CH_2F_2$, $C_3HF_7$, $C_3F_6$, $C_3H_2F_6$, $C_3H_2F_4$, $C_3H_3F_5$, $C_4HF_7$, $C_5HF_9$, $C_3F_8$, $CF_3I$, $C_2F_3I$, $C_2F_5I$, 1-Iodoheptafluoropropane (1-$C_3F_7I$), 2-Iodoheptafluoropropane (2-$C_3F_7I$), COS, FNO, F—C≡N, $CS_2$, $SO_2$, $SF_6$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), and cis-1,1,2,2,3,4-hexafluorocyclobutane (cis-$C_4H_2F_6$), and combinations thereof.

2. The method of claim 1, further comprising the step of introducing an oxidizer into the reaction chamber, wherein the oxidizer is selected from $O_2$, $O_3$, CO, $CO_2$, NO, $N_2O$, $NO_2$, $H_2O$, $H_2O_2$, COS, $SO_2$ and combinations thereof.

3. The method of claim 1, further comprising the step of introducing an inert gas into the reaction chamber, wherein the inert gas is selected from the group consisting of He, Ar, Xe, Kr, Ne and $N_2$.

4. The method of claim 1, wherein the film is a silicon-containing film that contains O and/or N and optionally contains dopants B, C, P, As Ga, In, Sn, Sb, Bi and/or Ge, and combinations thereof.

5. The method of claim 1, wherein the patterned mask layer is an a-C layer, a doped a-C layer, a photoresist layer, an anti-reflective layer, an organic planarization layer, a poly-Si layer, a metal oxide layer including a Ti oxide, an Al oxide, a Zr oxide, a Hf oxide, and combinations thereof.

6. The method of claim 1, wherein the patterned structure formed in the film has an aspect ratio between approximately 1:1 and approximately 200:1.

7. The method of claim 1, wherein a conductive sidewall passivation layer is formed on sidewalls of the patterned structure.

8. The method of claim 7, wherein a conductivity of the conductive sidewall passivation layer formed with the activated $C_4H_2F_6$ and the activated additive compound is at least approximately 10% higher than the conductivity of the conductive sidewall passivation layer formed with the activated $C_4H_2F_6$ without the addition of the activated additive compound.

9. A method for forming a patterned structure, the method comprising the steps:
sequentially or simultaneously exposing a substrate in a reaction chamber to a vapor of $C_4H_2F_6$ and $CH_3I$, the substrate having a film disposed thereon and a patterned mask layer disposed on the film;
activating a plasma to produce an activated $C_4H_2F_6$ and an activated $CH_3I$; and
allowing an etching reaction to proceed between the film uncovered by the patterned mask layer and the activated $C_4H_2F_6$ and the $CH_3I$ to selectively etch the film from the patterned mask layer, thereby forming the patterned structure.

10. The method of claim 9, further comprising the step of introducing an oxidizer into the reaction chamber, wherein the oxidizer is selected from $O_2$, $O_3$, CO, $CO_2$, NO, $N_2O$, $NO_2$, $H_2O$, $H_2O_2$, COS, $SO_2$ and combinations thereof.

11. The method of claim 9, further comprising the step of introducing an inert gas into the reaction chamber, wherein the inert gas is selected from the group consisting of He, Ar, Xe, Kr, Ne and $N_2$.

12. The method of claim 9, wherein a conductive sidewall passivation layer is formed on sidewalls of the patterned structure.

13. The method of claim 12, wherein a conductivity of the conductive sidewall passivation layer formed with the activated $C_4H_2F_6$ and the activated $CH_3I$ is at least approximately 10% higher than the conductivity of the conductive sidewall passivation layer formed with the activated $C_4H_2F_6$ without the addition of the activated $CH_3I$.

14. The method of claim 9, further comprising introducing an additional etch gas into the reaction chamber, wherein the additional etch gas is selected from the group consisting of $cC_4F_8$, $C_4F_8$, $cC_5F_8$, $C_5F_8$, $C_4F_6$, $CF_4$, $CH_3F$, $CF_3H$, $CH_2F_2$, $C_3HF_7$, $C_3F_6$, $C_3H_2F_6$, $C_3H_2F_4$, $C_3H_3F_5$, $C_4HF_7$, $C_5HF_9$, $C_3F_8$, $CF_3I$, $C_2F_3I$, $C_2F_5I$, 1-Iodoheptafluoropropane (1-$C_3F_7I$), 2-Iodoheptafluoropropane (2-$C_3F_7I$), COS, FNO, F—C≡N, $CS_2$, $SO_2$, $SF_6$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), and cis-1,1,2,2,3,4-hexafluorocyclobutane (cis-$C_4H_2F_6$), and combinations thereof.

15. A method for forming a patterned structure, the method comprising the steps:
sequentially or simultaneously exposing a substrate to a vapor of $C_4H_2F_6$ and $CH_3I$, the substrate having a film disposed thereon and a patterned mask layer disposed on the film;
activating a plasma to produce an activated $C_4H_2F_6$ and an activated $CH_3I$; and
allowing an etching reaction to proceed between the film uncovered by the patterned mask layer and the activated $C_4H_2F_6$ and the $CH_3I$ to selectively etch the film from the patterned mask layer, thereby forming the patterned structure, wherein the patterned structure formed in the film has an aspect ratio between approximately 1:1 and approximately 200:1.

* * * * *